United States Patent [19]
Noguchi et al.

[11] Patent Number: 5,583,809
[45] Date of Patent: Dec. 10, 1996

[54] SEMICONDUCTOR MEMORY CAPABLE OF REDUCING ERASE TIME

[75] Inventors: Kenji Noguchi; Kei Maejima, both of Hyogo, Japan

[73] Assignee: Mitsubishi Denki Kabushiki Kaisha, Tokyo, Japan

[21] Appl. No.: 439,743

[22] Filed: May 12, 1995

[30] Foreign Application Priority Data

Sep. 20, 1994 [JP] Japan .................................. 6-224449

[51] Int. Cl.$^6$ ................................................. G11C 11/34
[52] U.S. Cl. ............................ 365/185.11; 365/185.22; 365/185.29; 365/185.33
[58] Field of Search ........................... 365/185.11, 218, 365/236, 900, 185.22, 185.29, 185.33

[56] References Cited

U.S. PATENT DOCUMENTS

| | | | |
|---|---|---|---|
| 5,245,572 | 9/1993 | Kosonocky et al. | 365/185 |
| 5,297,096 | 3/1994 | Terada et al. | 365/185 |
| 5,343,434 | 8/1994 | Noguchi | 365/185 |
| 5,347,490 | 9/1994 | Terada et al. | 365/185 |
| 5,448,712 | 9/1995 | Kynett et al. | 365/185 |

FOREIGN PATENT DOCUMENTS

| | | |
|---|---|---|
| 2-289997 | 11/1990 | Japan . |
| 4-351794 | 12/1992 | Japan . |
| 5-74182 | 3/1993 | Japan . |

OTHER PUBLICATIONS

"A 5-V-Only 16-MB Flash Memory With Sector Erase Mode", Jinbo et al, IEEE Journal of Solid-State Circuits, vol. 27, No. 11, Nov. 1992.

*Primary Examiner*—David C. Nelms
*Assistant Examiner*—Trong Phan
*Attorney, Agent, or Firm*—Lowe, Price, LeBlanc & Becker

[57] ABSTRACT

A nonvolatile semiconductor memory comprising an erase pulse generator, an erase pulse counter and an erase verify signal generator. The erase pulse counter counts erase pulses output by the erase pulse generator, and the erase verify signal generator generates an erase verify signal. The erase pulse counter keeps the erase verify signal generator inactive until the number of the counted erase pulses exceeds a predetermined count. Only erase operations are allowed to continue while erase verify operations are being suppressed, until the erase pulse count exceeds the predetermined count. The scheme shortens the erase time involved.

23 Claims, 16 Drawing Sheets

SEMICONDUCTOR MEMORY CAPABLE OF REDUCING ERASE TIME

BACKGROUND OF THE INVENTION

1. Field of the Invention

The present invention relates to a nonvolatile semiconductor memory and, more particularly, to a nonvolatile semiconductor memory allowing data stored therein to be erased in units of blocks.

2. Description of the Invention

The flash memory is one of those kinds of nonvolatile semiconductor memories which are capable of being electrically erasable. Flash memories are each erasable not in bytes but as a whole (all bits of the entire chip) or in units of blocks (a plurality of blocks constituting the chip). Because one memory transistor represents one bit in each flash memory, the flash memory may serve as an inexpensive nonvolatile memory.

The conventional flash memory outlined above will now be described with reference to some of the accompanying drawings. FIG. 17 is a schematic view showing a typical memory transistor structure of the conventional flash memory.

Referring to FIG. 17, the memory transistor comprises a P-type substrate 1, N+ diffused layers 2 and 3 each acting as a drain or a source, a control gate 4, a floating gate 5, and insulating films 6 and 7.

The N+ diffused layer 2 is used as the drain and the N+ diffused layer 3 as the source. In the memory cell array, the drain 2 is connected to a bit line, the source 3 to a source line, and the control gate 4 to a word line. At write time, the floating gate 5 captures electrons. When power is turned off, the floating gate 5 keeps intact the state it was in following the write operation. At erase time, the floating gate 5 releases the electrons it captured. The insulating film 6 is interposed between the floating gate and the substrate and is called a tunnel oxide film. The name of the film 6 is derived from the fact that at erase time, the electrons inside the floating gate 5 are released into the drain 2 or source 3 through tunneling. The insulating film 7 is interposed between the gate and the floating gate, and is usually formed with an oxide film about 200 A thick.

The relations between the gate voltage and the drain current in the memory transistor will now be discussed. As illustrated in FIG. 17, it is assumed that the drain 2, source 3 and control gate 4 are fed respectively with voltages VD, VS and VG, and that a current ID flows between the drain 3 and the source 3. FIG. 18 is a view showing the VG-ID characteristic of the memory transistor.

For a write operation on the memory transistor, a positive high voltage is given to the drain 2 and control gate 4, and a grounding potential is fed to the source 3. At this point, a channel is formed between the drain 2 and the source 3. While the channel allows a current to flow therethrough, hot electrons are generated in a depletion layer of the drain 2. An electrical field generated by the positive voltage fed to the control gate 4 causes the floating gate 5 to attract and capture the hot electrons. The electrons captured inside the floating gate 5 cause the threshold value Vth of the memory transistor to shift upward after the write operation, to become VthP shown in FIG. 18.

For an erase operation on the memory transistor, the source 3 is supplied with a positive high voltage. At this time, the control gate 4 is connected to the grounding potential and the drain 2 is allowed to float. This causes an electrical field between the source 3 and the floating gate 5 to develop tunneling, thereby, releasing the electrons captured by the floating gate 5 into the source 3. After the erase operation, the threshold value Vth of the memory transistor shifts downward, to become VthE in FIG. 18. In this manner, the flash memory allows data to be written thereto and erased therefrom in accordance with the status change of the threshold value Vth for the memory transistor.

The conventional flash memory having the above-described type of memory transistors will be described in more detail. FIG. 19 is a block diagram showing a typical structure of the conventional flash memory.

Referring to FIG. 19, the flash memory comprises a row address buffer RAB, a row decoder RD, a column address buffer CAB, a column decoder CD, memory address blocks MB0–MB7, erase circuits EE0a–EE7a, EE0b–EE7b, column gates CG0a–CG7a, CG0b–CG7b, sense amplifiers SA0a–SA7a, SA0b–SA7b, next-pulse control circuits NC0a–NC7a, NC0b–NC7b, output switching circuits OS0–OS7, and input/output buffers IOB0–IOB7.

The memory cell array blocks MB0–MB7 have 1K×1K (1K=1024) memory cells arranged into an array of 1M bits, comprising 1K word lines and 1K bit lines. The memory cell array blocks MB0–MB7 correspond respectively with input/output data D0–D7. Each of the memory cell array blocks MB0–MB7 is further divided into, say, two blocks. Illustratively, the memory cell array block MB0 is divided into blocks B0 and B0b. Corresponding respectively with the blocks B0a–B7a, B0b–B7b, there are provided the erase circuits EE0a–EE7a, EE0b–EE7b, the column gates CG0a–CG7a, CG0b–CG7b, the sense amplifiers SA0a–SA7a, SA0b–SA7b, and the next-pulse control circuits NC0a–NC7a, NC0b–NC7b. Furthermore, the input/output buffers IOB0–IOB7 and the output switching circuits OS0–OS7 are provided to correspond respectively with the input/output data D0–D7.

There exist 17 address signal lines. The address signals over the lines A0–A9 are input to the row decoder RD via the row address buffer RAB. The output of the row decoder RD causes one of a plurality of word lines WL to be selected. The remaining seven address signals A10–A16 are input to the column decoder CD via the column address buffer CAB. The output of the column decoder CD causes one of the multiple column gates CG0a–CG7a, CG0b–CG7b to conduct in accordance with the input/output data D0–D7. Then the bit line corresponding to the conducting column gate is selected.

For a write operation, the eight-bit input data D0–D7 is input to the sense amplifiers SA0a–SA7a, SA0b–SA7b via the input/output buffers IOB0–IOB7, the sense amplifiers acting as write circuits. The data is written to the memory cells selected as per the input data. That is, the desired data is written to the desired memory cells by applying a high voltage to the bit lines of the memory cells in question and by feeding the undesired memory cells with a low voltage such as the grounding potential. At this point, the selected word line is fed with the high voltage and the unselected word lines are connected to the grounding potential. As a result, data "1" is stored before the write operation (i.e., after erasure) and data "0" is stored after the write operation.

For a read operation, as in the case of the write operation, one word line is selected and so is one bit line with respect to each of the data D0–D7. The selected word line develops a read supply voltage VCC (usually 5 V), causing the corresponding one of the sense amplifiers SA0a–SA7a, SA0b–SA7b to operate. As discussed with reference to FIG. 18, when the word line has the voltage VCC (i.e., VG=VCC), the threshold value Vth of the memory cell in the erase state becomes lower than the supply voltage (i.e., VthE<VCC), which allows the drain current ID to flow. The threshold value Vth of the memory cell in the write state becomes higher than the supply voltage (i.e., VthP>VCC), which prevents the drain current ID from flowing. Thus the sense amplifiers SA0a–SA7a, SA0b–SA7b each check to see if the drain current ID flows. The result of the check is output via the output switching circuits OS0–OS7 to the input/output buffers IOB0–IOB7, whereby the output data D0–D7 is output.

For an erase operation, the source of each memory cell in question is fed with a high voltage via the erase circuits EE0a–EE7a, EE0b–EE7b. A plurality of (in this example, 2) erase circuits are furnished for each of the input/output data. The column gates and the sense amplifiers are also provided likewise. Each sense amplifier is connected to a next-pulse control circuit. Output signals N0a–N7a, N0b–N7b of the next-pulse control circuits are fed back to the corresponding erase circuits. Outputs S0a–S7a, S0b–S7b of the sense amplifiers are input to the corresponding output switching circuits. In turn, the outputs of the output switching circuits are input to the input/output buffers. When an erase instruction is executed, a first erase operation is carried out initially. The first erase operation is followed by the selection of an erase verify mode in which a check is made to see if the data in question is indeed erased. At this point, all sense amplifiers SAia, SAib (i=0–7) provided for the respective data are activated, and the column gates CGia, CGib are selected. This causes the data to be read from the applicable memory cells. That is, for each selected word line, the column gates corresponding to the erase circuits in question are selected. In this example, two column gates are selected for one selected word line. The data in the memory cells in question are read by means of the corresponding sense amplifiers and input to the corresponding next-pulse control circuits.

The next-pulse control circuits will now be described in more detail. FIG. 20 is a circuit diagram showing a typical structure of the next-pulse control circuits in FIG. 19. Referring to FIG. 20, each next-pulse control circuit includes NOR circuits G101 and G102.

The output terminal of the NOR circuit G101 is connected to one of two input terminals of the NOR circuit G102. The output terminal of the NOR circuit G102 is connected to one of two input terminals of the NOR circuit 101. The other input terminal of the NOR circuit 101 is supplied with a sense amplifier output signal Si. The other input terminal of the NOR circuit G102 is fed with an erase verify start signal EBSS. In this setup, the NOR circuits G101 and G102 constitute a flip-flop circuit. The erase verify start signal EBSS is a high-level one-shot pulse that is output at the start of an erase verify operation. The sense amplifier output signal Si is driven High when the data of the transistor making up the memory cell is "1," and brought Low when that data is "0."

When an erase verify operation is started, the erase verify start signal EBSS is input at the high level while the output Ni of the flip-flop circuit is fixed to the low level. In this state, the NOR circuit G101 receives the sense amplifier output signal Si that is output from the sense amplifiers in keeping with the memory cell data. For example, if the memory cell data is "0" (i.e., yet to be erased), the output Ni remains unchanged (i.e., an indication of the data not being erased). In this case, the erase circuit is activated in the next erase operation to erase the memory cell data. If the memory cell data is "1" (i.e., erasure judged complete), the output Ni is driven High. In this case, the erase circuit is inactivated in the next erase operation so as to suppress erasure. That is, the erase circuit is activated or inactivated depending on the output Ni of the next-pulse control circuit.

The output switching circuits will now be described in more detail. FIG. 21 is a circuit diagram showing a typical structure of the output switching circuits in FIG. 19. Referring to FIG. 21, each output switching circuit comprises a NAND circuit G103, an inverter G104, PMOS transistors Q101 and Q102, and NMOS transistors Q103 and Q104.

A transmission gate constituted by the transistors Q101 and Q103 receives a sense amplifier output signal Sib (e.g., output signal S0b of the sense amplifier SA0b) and a sense amplifier output signal Sia (e.g., output signal S0a of the sense amplifier SA0a). The gate of the transistor Q101 receives a control signal EV, and the gate of the transistor Q103 receives a control signal /EV. The control signal EV is driven High during an erase verify operation and brought Low otherwise; the control signal /EV is the inverted signal of the control signal EV. (A slash "/" indicates an inverted signal hereinafter.) The sense amplifier output signals Sib and Sia are input to the NAND circuit G103. The NAND circuit G103 is connected to the inverter G104. In turn, the inverter G104 is connected to a transmission gate made up of the transistors Q102 and Q104. The gate of the transistor Q102 receives the control signal /EV, and the gate of the transistor Q104 receives the control signal EV. An output signal Oi is output by the two transmission gates, one composed of the transistors Q101 and Q103, the other constituted by the transistors Q102 and Q104.

The output switching circuit of the above structure operates as follows: a plurality of (in this example, 2) sense amplifiers are provided for each of the input/output data D0–D7. The output signals of these sense amplifiers are input to the corresponding next-pulse control circuits as well as to the single applicable output switching circuit. During an erase verify operation, the control signal EV is driven High and the control signal /EV brought Low. This turns on the transmission gate made up of the transistors Q102 and Q104, thus allowing the signal from the NAND circuit G103 to reach the output buffer via the inverter G104. That is, only if the outputs of the multiple sense amplifiers are all High, is the output signal Oi also High indicating the completion of data erasure. If at least one sense amplifier has a low-level output (prompting an "unerased" judgment), then the output signal Oi is Low. In this case, the entire chip remains unerased and is to be erased the next time. In the next-pulse control circuits, the outputs of the sense amplifiers are judged individually. The erase circuit connected to each memory cell judged to be erased stays inactive, so that no superfluous erase operation is carried out.

The flash memory is erased by one of two methods: an externally controlled erasure method whereby the erasure procedures outlined above are performed under external control, and an auto chip erasure method whereby all erasure-related operations are controlled from inside the chip. Under the auto chip erasure method, the process of erasure followed by the verification thereof is carried out repeatedly within the chip, until all addresses have been verified as erased.

Constituted as described, the conventional flash memory has each of its erase circuits checked for erasure during an erase verify operation. Even a single erase circuit judged to be unerased causes the ongoing erase verify operation to be halted and an erase operation to be resumed. The addresses are erased and then verified as erased one by one. This means that even if a memory cell connected to another erase circuit has in fact yet to be erased when a given address is reached, that memory cell is judged to be erased and remains undetected at that point. Only when the applicable address is reached, is the memory cell in question judged to be unerased and given an erase pulse. Because unerased memory cells at different addresses are erased using only the applicable erase circuits, the total erase time tends to be prolonged.

SUMMARY OF THE INVENTION

It is therefore an object of the present invention to provide a nonvolatile semiconductor memory capable of reducing erase time.

In carrying out the invention and according to one aspect thereof, there is provided a nonvolatile semiconductor memory having memory cell array blocks furnished in accordance with input/output data, the memory cell array blocks being further divided into a plurality of blocks. This nonvolatile semiconductor memory comprises: an erase pulse output circuit for outputting erase pulses; a counter for counting the erase pulses and, when the number of the erase pulses is found to reach an initial erase upper limit, for outputting an erase verify enable signal for enabling an erase verify operation; an erase verify signal output circuit for outputting an erase verify signal in accordance with the erase verify enable signal; a plurality of erase verifying circuits furnished to correspond respectively with the plurality of blocks, the erase verifying circuits performing erase verify operations on the data stored in the corresponding blocks in response to the erase verify signal; and a plurality of erase circuits furnished to correspond respectively with the plurality of blocks, the erase circuits erasing the data stored in the corresponding blocks in response to the erase pulses.

With this structure, the erase verify enable signal is output when the number of the counted erase pulses reaches the initial erase upper limit. In response to the erase verify enable signal thus generated, the multiple erase verifying circuits carry out erase verify operations on the data stored in the corresponding blocks. That is, no erase verify operation is executed and only erase operations are performed by the erase circuits until the number of the counted erase pulses reaches the initial erase upper limit. Because the time required to conduct the erase verify operations is eliminated, the erase time is reduced.

According to another aspect of the invention, there is provided a nonvolatile semiconductor memory comprising: a memory cell array including a plurality of nonvolatile memory cells for storing data; an erase pulse output circuit for outputting erase pulses; a counter for counting the erase pulses and, when the number of the erase pulses is found to reach an initial erase upper limit, for outputting an erase verify enable signal for enabling an erase verify operation; an erase verify signal output circuit for outputting an erase verify signal in accordance with the erase verify enable signal; a plurality of erase verifying circuits for performing erase verify operations on the data stored in the memory cell array; and a plurality of erase circuits for erasing the data stored in the memory cell array in response to the erase pulses; wherein the counter varies the initial erase upper limit in accordance with the level of a high voltage supplied externally to the semiconductor memory.

With this structure, the initial erase upper limit is varied depending on the level of the externally supplied high voltage. This makes it possible to optimize the number of times the erase operation is carried out in accordance with the high voltage level. Because unnecessary erase pulses are not generated, the erase time is reduced.

According to a further aspect of the invention, there is provided a nonvolatile semiconductor memory having memory cell array blocks furnished in accordance with input/output data, the memory cell array blocks being further divided into a plurality of blocks. This nonvolatile semiconductor memory comprises: an erase pulse output circuit for outputting erase pulses; a plurality of erase verifying circuits furnished to correspond respectively with the plurality of blocks, the erase verifying circuits performing erase verify operations on the data stored in the corresponding blocks; a plurality of erase circuits furnished to correspond respectively with the plurality of blocks, the erase circuits erasing the data stored in the corresponding blocks in response to the erase pulses; and an erase pulse control circuit for outputting an erase pulse control signal in response to the erase pulses when the erase verifying circuits judge that all data stored in the plurality of blocks has yet to be erased; wherein the erase pulse output circuit outputs the erase pulses in response to the erase pulse control signal.

With this structure, the erase pulse control signal is output only if all data in all the multiple blocks is judged to be unerased, and the erase pulses are output in response to the erase pulse control signal thus generated. That is, erase verify operations are allowed to continue until all data in all the multiple blocks is judged to be unerased. Because unnecessary erase pulses are not generated, the erase time is reduced.

According to an even further aspect of the invention, there is provided a nonvolatile semiconductor memory having memory cell array blocks furnished in accordance with input/output data, the memory cell array blocks being further divided into a plurality of blocks. This nonvolatile semiconductor memory comprises: an erase pulse output circuit for outputting erase pulses; a plurality of erase verifying circuits furnished to correspond respectively with the plurality of blocks, the erase verifying circuits performing erase verify operations on the data stored in the corresponding blocks; a plurality of erase circuits furnished to correspond respectively with the plurality of blocks, the erase circuits erasing the data stored in the corresponding blocks in response to the erase pulses; a designating circuit for designating the most quickly erasable block from among the plurality of blocks; and an erase pulse control circuit for outputting an erase pulse control signal until all data stored in the most quickly erasable block designated by the designating circuit has been erased, the output of the erase pulse control signal being effected solely in accordance with the judgment made by the erase verifying circuit which, selected from among the plurality of erase verifying circuits, corresponds to the most quickly erasable block; wherein the erase pulse output circuit outputs the erase pulses in response to the erase pulse control signal.

With this structure, the erase pulse control signal is output solely in accordance with the judgment made by the erase verifying circuit which corresponds to the most quickly erasable block until all data stored in the most quickly erasable block has been erased. The judgments by all remaining erase verifying circuits are discarded. The erase pulses are output in response to the erase pulse control signal thus generated. This means that the erase operation is carried out only in accordance with the result of the erase verify operation performed on the most quickly erasable block. Because unnecessary erase pulses are not generated, the erase time is reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
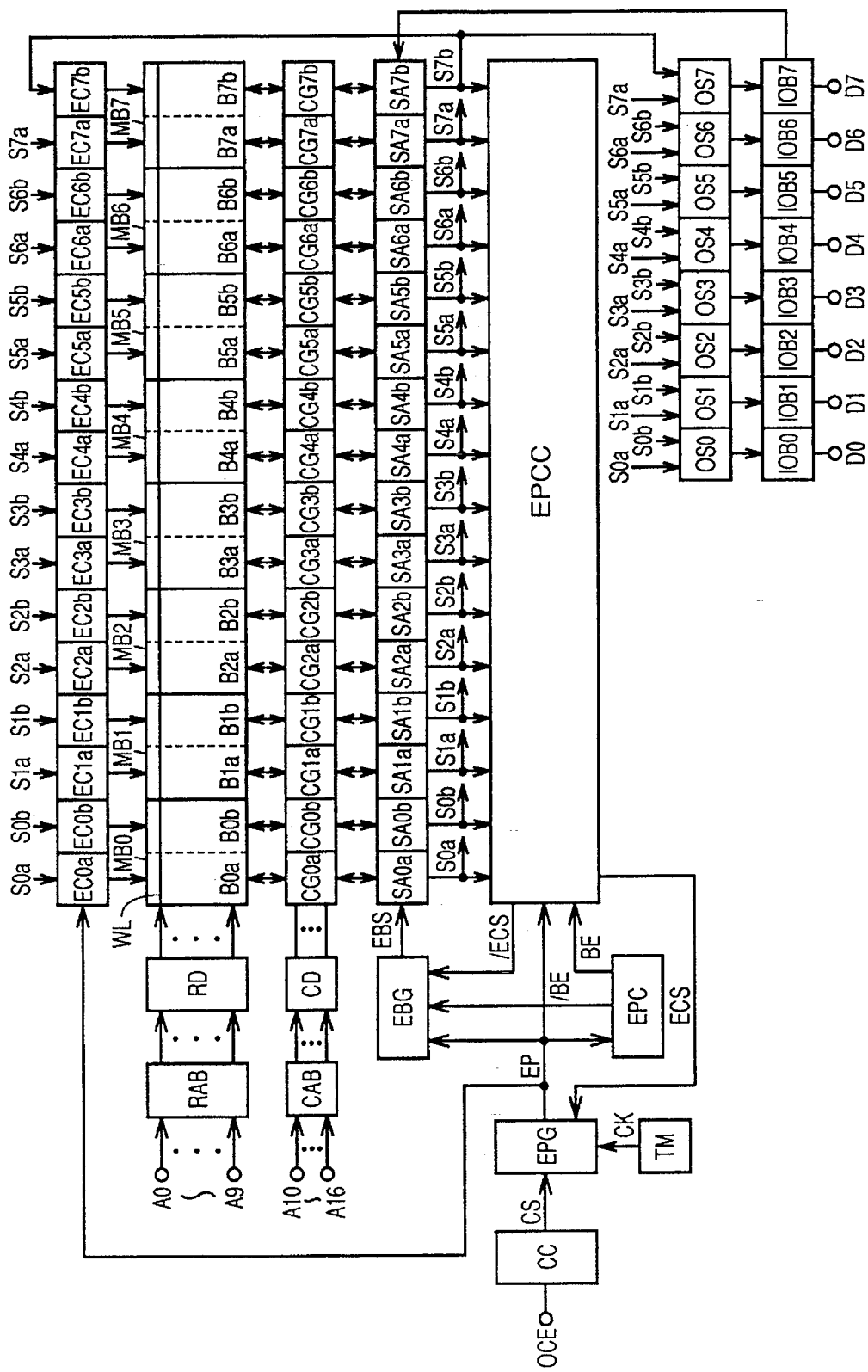
FIG. 1 is a block diagram outlining the structure of a flash memory practiced as a first embodiment of the invention.

Preferred embodiments of the invention will now be described with reference to the accompanying drawings. FIG. 1 is a block diagram outlining the structure of a nonvolatile semiconductor memory practiced in the form of a flash memory serving as the first embodiment of the invention.

Referring to FIG. 1, the flash memory comprises a row address buffer RAB, a row decoder RD, a column address buffer CAB, a column decoder CD, erase circuits EC0a–EC7a, EC0b–EC7b; memory cell array blocks MB0–MB7, column gates CG0a–CG7a, CG0b–CG7b; sense amplifiers SA0a–SA7a, SA0b14 SA7b; a control circuit CC, an erase pulse generation circuit EPG, an internal timer TM, an erase pulse counter EPC, an erase verify signal generation circuit EBG, an erase pulse control circuit EPCC, output switching circuits OS0–OS7, and input/output buffers IOB0–IOB7.

The memory cell array blocks MB0–MB7 are furnished to correspond respectively with input/output data D0–D7. The memory cell array blocks MB0–MB7 are each divided further into two blocks B0a–B7a, B0b–B7b. Corresponding to the blocks B0a–B7a, B0b–B7b, there are provided respectively the erase circuits EC0a–EC7a, EC0b–EC7b; the column gates CG0a–CG7a, CG0b–CG7b; and the sense amplifiers SA0a–SA7a, SA0b–SA7b. In addition, the output switching circuits OS0–OS7 and the input/output buffers IOB0–IOB7 are provided to correspond respectively with the input/output data D0–D7. Although the first embodiment has each of its memory cell array blocks divided into two blocks, this is not limitative of the invention. In implementing the invention, each memory cell array block may be divided into any number of blocks as long as each of the divided blocks is furnished with an erase circuit, a column gate and a sense amplifier.

Figure 19:
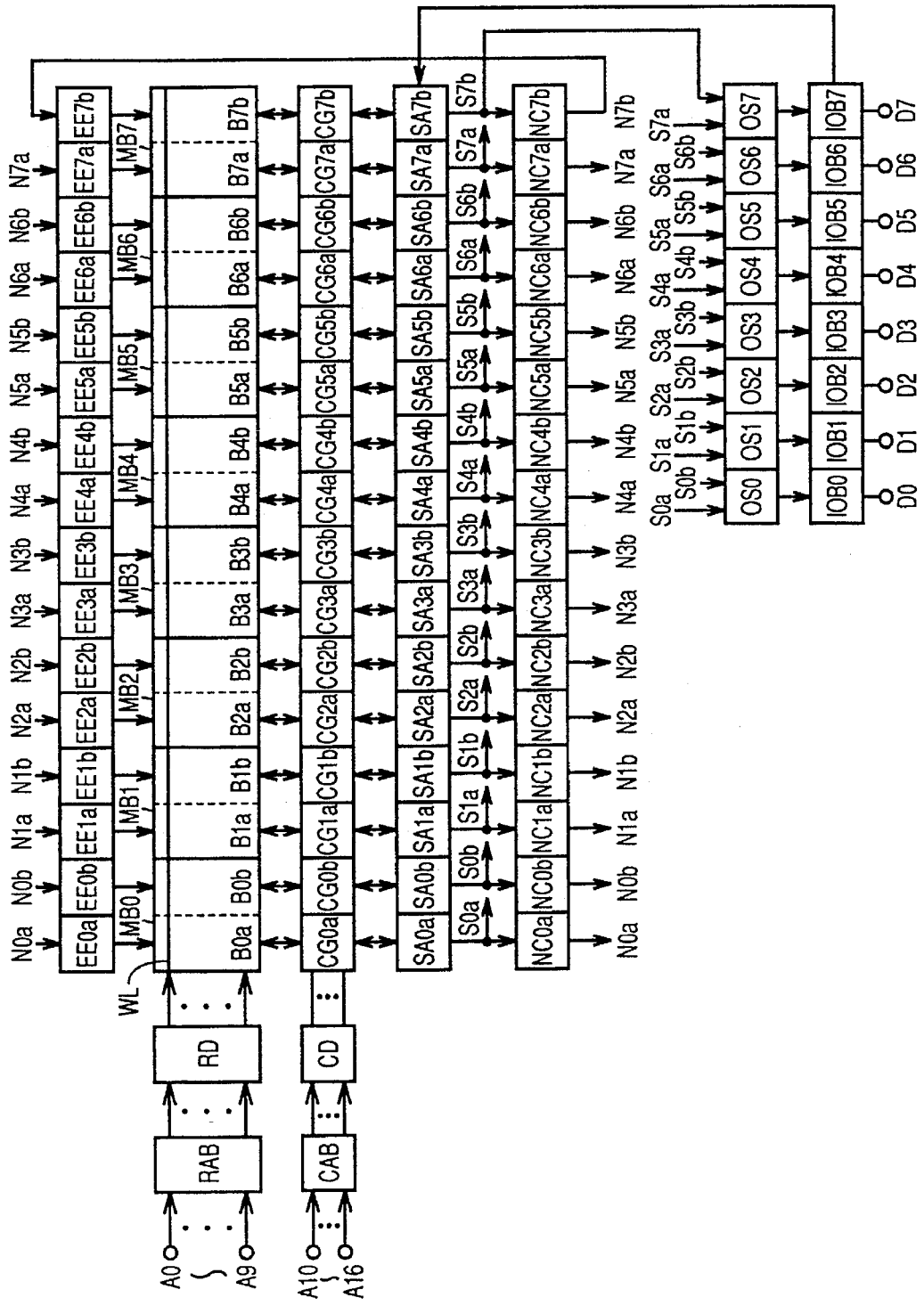
FIG. 19 is a block diagram indicating a typical structure of the conventional flash memory.
Figure 20:
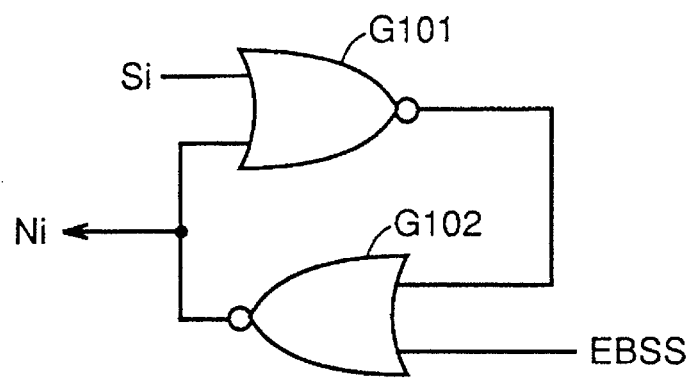
FIG. 20 is a circuit diagram representing a typical structure of the next-pulse control circuits shown in FIG. 19.
Figure 21:
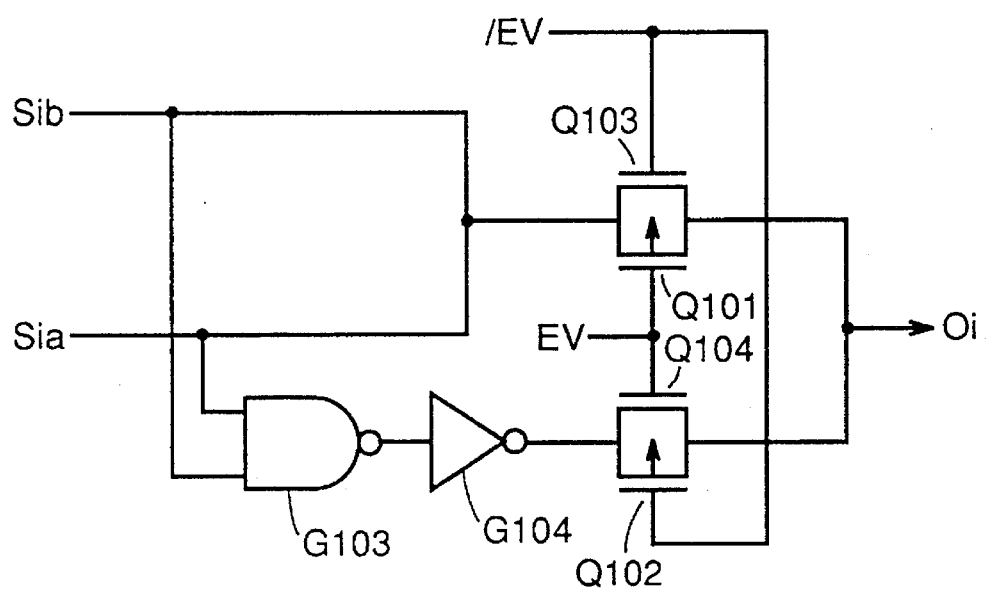
FIG. 21 is a circuit diagram sketching a typical structure of the output switching circuits shown in FIG. 19.

The row address buffer RAB, row decoder RD, column address buffer CAB, memory cell array blocks MB0–MB7, column gates CG0a–CG7a, CG0b–CG7b; sense amplifiers SA0a–SA7a, SA0b–SA7b; output switching circuits OS0–OS7, and input/output buffers IOB0–IOB7 in FIG. 1 are identical structurally and functionally to their counterparts in the conventional flash memory shown in FIG. 19. The descriptions of these component parts will be omitted hereunder where redundant.

The control circuit CC receives from the outside an auto chip erase signal OCE designating automatic chip erasure. In response to the received auto chip erase signal OCE, the control circuit CC supplies the erase pulse generation circuit EPG with an erase start signal CS designating the start of an erase operation. The erase pulse generation circuit EPG receives a clock signal CK of a predetermined frequency from the internal timer TM. Given the erase start signal CS and the clock signal CK, the erase pulse generation circuit EPG sends erase pulses EP to the erase pulse control circuit EPCC, to the erase pulse counter EPC, to the erase verify signal generation circuit EBG, and to the respective erase circuits EC0a–EC7a, EC0b–EC7b. The erase pulse counter EPC counts the received erase pulses EP and, when the number of the counted erase pulses EP exceeds a predetermined count (i.e., initial erase upper limit), transmits an erase verify enable signal BE and its inverted signal /BE respectively to the erase pulse control circuit EPCC and the erase verify signal generation circuit EBG. Responding to the erase pulses EP and the erase verify enable signal BE, the erase pulse control circuit EPCC outputs an erase pulse control signal ECS to the erase pulse generation circuit EPG. At the same time, the erase pulse control circuit EPCC outputs the inverted signal /ECS of the erase pulse control signal ECS to the erase verify signal generation circuit EBG. In response to the erase pulses EP, the inverted erase verify enable signal BE and the inverted erase pulse control signal /ECS, the erase verify signal generation circuit EBG sends an erase verify signal EBS to the sense amplifiers SA0a–SA7a, SA0b–SA7b.

The erase circuits EC0a–EC7a, EC0b–EC7b receive sense amplifier output signals S0a–S7a, S0b–S7b respectively from the corresponding sense amplifiers SA0a–SA7a, SA0b–SA7b. Responding to the erase pulses EP and the sense amplifier output signals Si (i=1a–7a, 1b–7b), the erase circuits EC0a–EC7a, EC0b–EC7b erase the data in the corresponding blocks Bi.

Below is a description of the flash memory of the above constitution operating in erase and verify operations. Because the erase and the verify operation are carried out successively on each of the memory cell array blocks MB0–MB7, the operations on the block MB0 alone will be discussed as a representative example. The other memory cell array blocks MB1–MB7 are also subject to the same operations.

Upon receipt of an auto chip erase signal OCE from the outside and after completion of the write operation preceding the current erase operation, the control circuit CC activates the erase start signal CS. The activated erase start signal is input to the erase pulse generation circuit EPG. Given the erase start signal CS, the erase pulse generation circuit outputs a first erase pulse EP to the erase verify signal generation circuit EBG, to the erase pulse control circuit EPCC, to the erase pulse counter EPC, and to two erase circuits EC0a and EC0b. The erase circuits EC0a and EC0b supply the sources of the memory transistors in the blocks B0a and B0b with the received erase pulse EP for erasure. At this point, the erase pulse counter EPC counts the received erase pulse EP as generation of a single pulse.

Following the first erase operation, the conventional flash memory would have the erase verify signal entered into the sense amplifiers SA0a and SA0b for an erase verify operation. With the first embodiment of the invention, by contrast, the erase verify signal generation circuit EBG receives the inverted erase verify enable signal /BE from the erase pulse counter EPC. Unless and until the number of the received erase pulses EP reaches a predetermined count, the inverted erase verify enable signal /BE does not enable an erase verify operation, and the erase verify signal generation circuit EBG remains inactive. The erase pulse control circuit EPCC receives the erase verify enable signal BE from the erase pulse counter EPC. Here, too, the erase verify enable signal BE does not enable an erase verify operation until the number of the received erase pulses reaches a predetermined count. At this point, the erase pulse control circuit EPCC outputs the erase pulse control signal ECS ordering the erase pulse generation circuit EPG to generate the next erase pulse.

As described, the erase operation is carried out a predetermined number of times with no erase verify operation carried out. When the number of the erase pulses EP output by the erase pulse generation circuit EPG exceeds a predetermined count, the erase verify enable signal BE and the inverted erase verify enable signal /BE output by the erase pulse counter EPC enable an erase verify operation. This activates the erase verify signal generation circuit EBG, outputting the erase verify signal EBS to the sense amplifiers SA0a and SA0b. The erase verify signal EBS in turn activates the sense amplifiers SA0a and SA0b which carry out an erase verify operation. Specifically, the sense amplifiers SA0a and SA0b verify the data in the blocks B0a and B0b via the column gates CG0a and CG0b. The results of the verification are output as the sense amplifier output signals S0a and S0b to the erase circuits EC0a and EC0b and to the erase pulse control circuit EPCC. If the verification reveals that at least one bit remains unerased, the erase pulse control circuit EPCC outputs the erase pulse control signal ECS to the erase pulse generation circuit EPG. Responding to the received erase pulse control signal ECS, the erase pulse generation circuit EPG outputs an erase pulse EP to the erase circuits EC0a and EC0b. If the sense amplifier output signal S0a indicates that erasure has yet to be completed, the erase circuit EC0a forwards the received erase pulse EP to the block B0a for erasure. If the sense amplifier output signal S0a indicates that erasure has been complete, the erase circuit EC0a does not output the received erase pulse EP and no erase operation takes place. The erase circuit EC0b works in the same manner as the erase circuit EC0a. When the results of the verification show that all data has been erased following the above process, the erase operation comes to an end.

Figure 2:
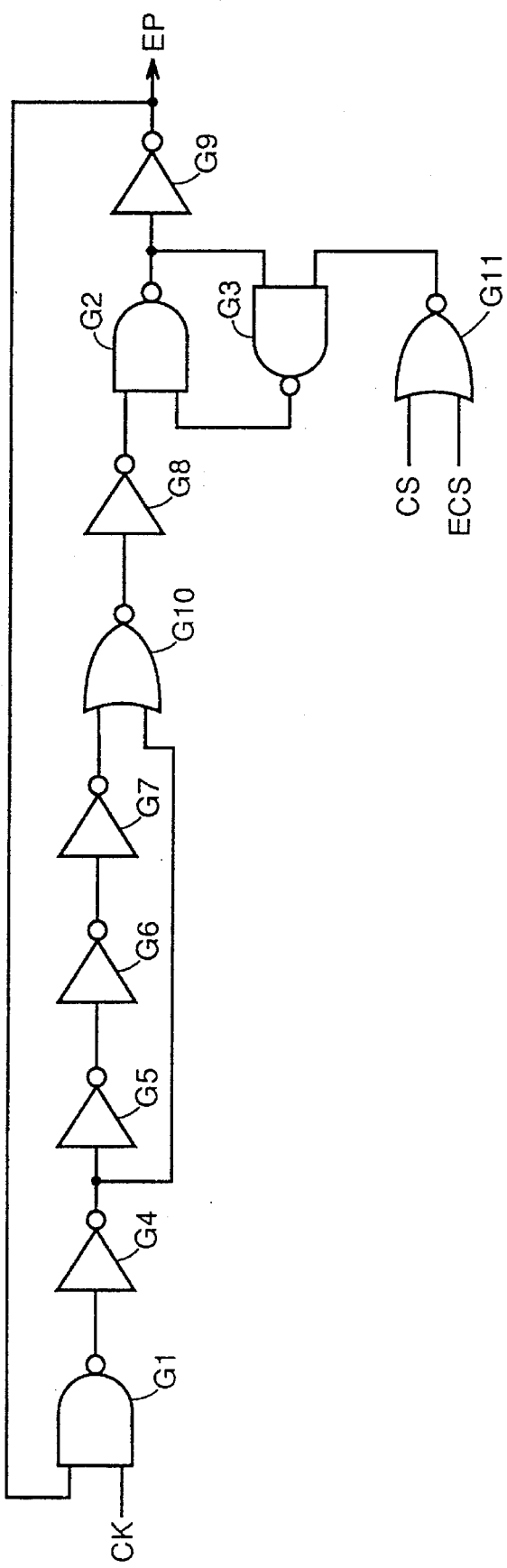
FIG. 2 is a circuit diagram depicting the structure of the erase pulse generation circuit shown in FIG. 1.
Figure 3:
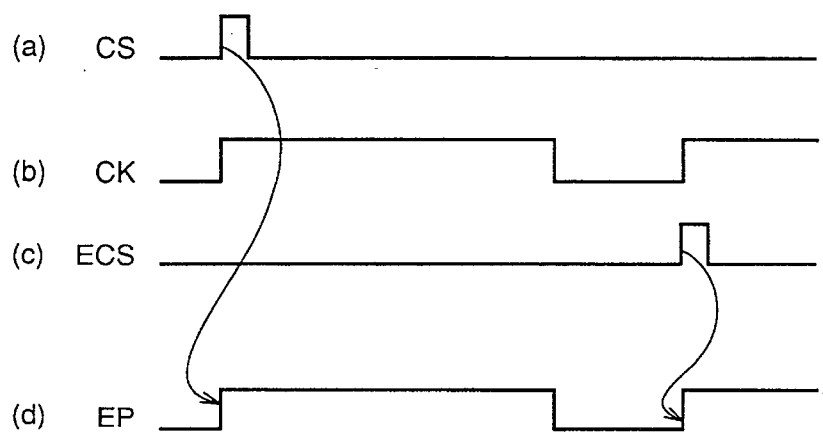
FIGS. 3(a)–(d) are timing charts for explaining the operation of the erase pulse generation circuit of FIG. 2.

The erase pulse generation circuit shown in FIG. 1 will now be described in more detail. FIG. 2 is a circuit diagram depicting the structure of the erase pulse generation circuit in FIG. 1.

Referring to FIG. 2, the erase pulse generation circuit comprises NAND circuits G1–G3, inverters G4–G9, and NOR circuits G10 and G11.

The NAND circuit G1 receives a clock signal CK from the internal timer TM. The NAND circuit G1 is connected to the inverter G4. The inverter G4 is connected to the inverter G5 and the NOR circuit G10. The inverter G5 is connected to the inverter G6 which in turn is connected to the inverter G7. The inverter G7 is connected to the NOR circuit G10 coupled to the inverter G8. The inverter G8 is connected to the NAND circuit G2 whose output terminal is connected to one input terminal of the AND circuit G3. The output terminal of the NAND circuit G3 is connected to one input terminal of the NAND circuit G2. This means that the NAND circuits G2 and G3 constitute a latch circuit. The NOR circuit G11 receives the erase start signal CS from the control circuit CC and the erase pulse control signal ECS from the erase pulse control circuit EPCC. The output terminal of the NOR circuit G11 is connected to the other input terminal of the NAND circuit G3. The output terminal of the NAND circuit G2 is connected to the inverter G9. In turn, the inverter G9 is connected to one input terminal of the NAND circuit G1. The output terminal of the inverter G9 outputs erase pulses EP.

Below is a description of the operation of the erase pulse generation circuit of the above constitution. FIGS. 3(a)–(d) are timing charts for explaining the operation of the erase pulse generation circuit of FIG. 2.

Referring to FIGS. 3(a)–(d), bringing the erase start signal CS from Low to High drives Low one input node of the latch circuit made up of the AND circuits G2 and G3 (i.e., output of the NOR circuit G11 at the low level). This drives the output node of the latch circuit (i.e., output of the NAND circuit G2) Low and the erase pulse EP High. At this point, the clock signal CK goes from High to Low upon elapse of a predetermined time (about 10 ms). This drives Low the other input node of the latch circuit (i.e., output of the inverter G8), thereby inverting the latch circuit output and bringing the erase pulse EP Low. The above process causes one erase pulse EP to be output. Likewise, when the erase pulse control signal ECS from the erase pulse control circuit goes from Low to High (provided that the number of the output erase pulses EP has yet to reach a predetermined count), one erase pulse EP is output. Thus the erase pulse generation circuit outputs the initial one erase pulse EP in response to the erase start signal CS. Thereafter, the erase pulse generation circuit keeps outputting erase pulses in response to the erase pulse control signal ECS until the number of the output erase pulses EP reaches the predetermined count.

Figure 4:
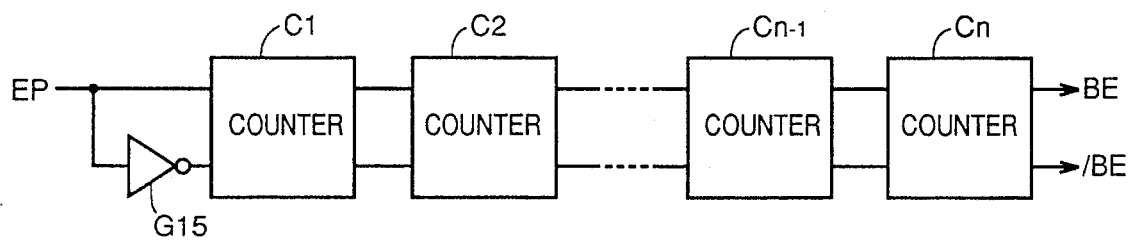
FIG. 4 is a block diagram indicating the structure of a first example of the erase pulse counter shown in FIG. 1.

The erase pulse counter shown in FIG. 1 will now be described in more detail. FIG. 4 is a block diagram indicating the structure of the first example of the erase pulse counter included in FIG. 1.

Referring to FIG. 4, the erase pulse counter comprises counters C1–Cn and an inverter G15. The counter C1 receives the erase pulse EP as well as the inverted erase pulse /EP via the inverter G15. The counter C1 divides the input erase pulse EP and forwards mutually complementary signals to the counter C2. The counter C2, on its part, divides the input complementary signals and outputs the further-divided complementary signals downstream. The counters C3–Cn operate likewise. In the end, the erase verify enable signals BE and /BE are output as a result of dividing the erase pulse EP by a factor of 2n.

Figure 5:
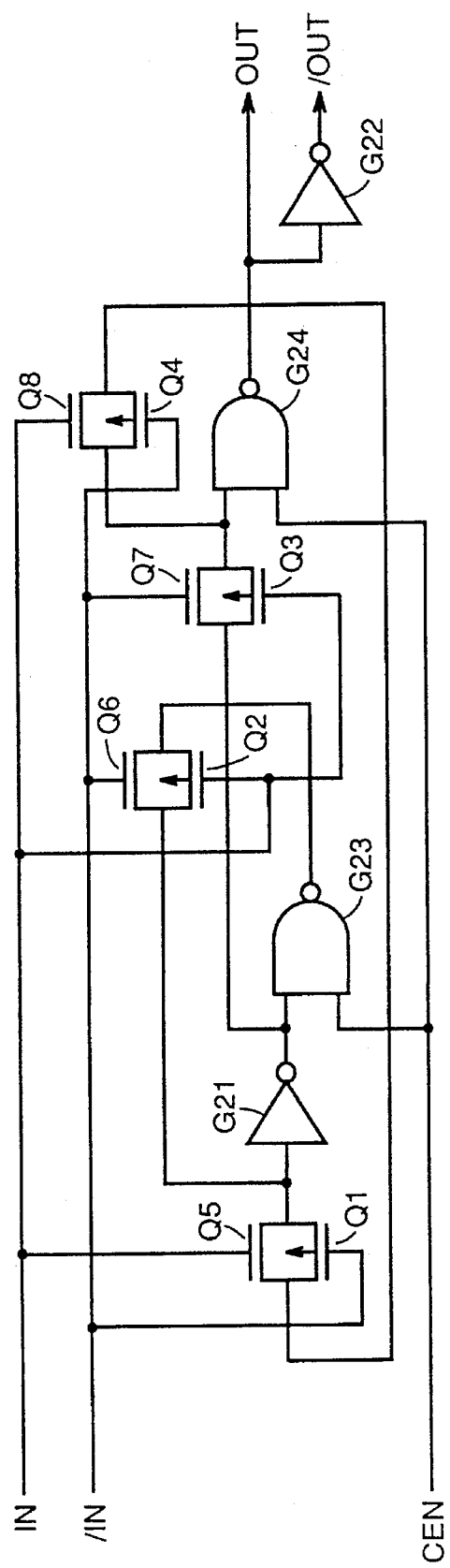
FIG. 5 is a circuit diagram showing the structure of one of the component counters shown in FIG. 4.
Figure 6:
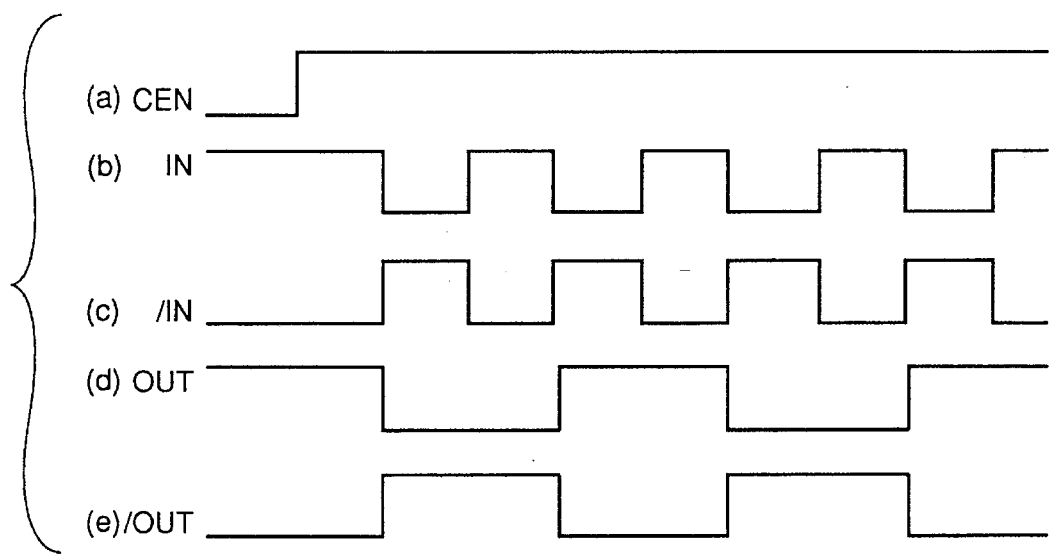
FIGS. 6(a)–(e) are timing charts for explaining the operation of the counter of FIG. 5.
Figure 8:
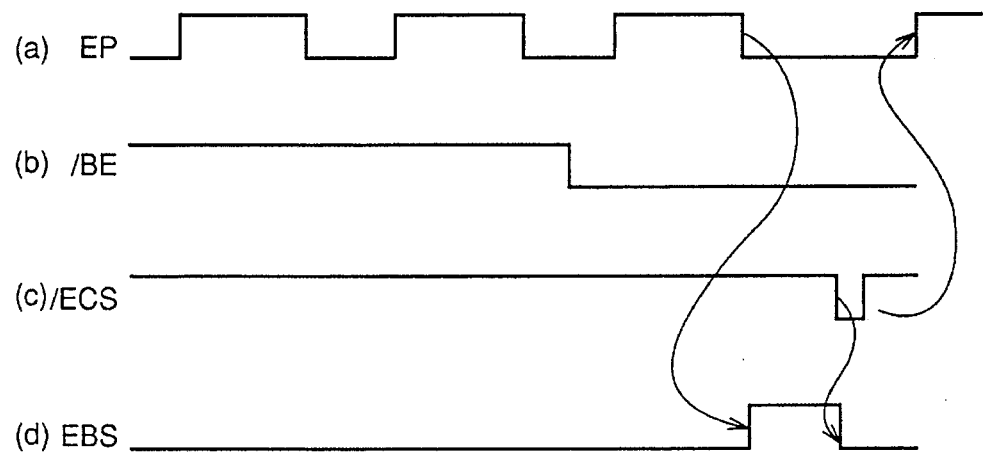
FIGS. 8(a)–(d) are timing charts for explaining the operation of the erase verify signal generation circuit of FIG. 7.

The erase pulse counter of FIG. 4 will now be described in more detail. FIG. 5 is a circuit diagram giving the structure of one of the component counters shown in FIG. 4. As illustrated, the erase pulse counter of FIG. 4 is constituted by N units of the counter shown in FIG. 5, the N component counters being serially connected.

Referring to FIG. 5, the counter comprises PMOS transistors Q1–Q4, NMOS transistors Q5–Q8, inverters G21 and G22, and NAND circuits G23 and G24. An input signal IN is either the erase pulse EP or the output signal from the preceding counter. An input signal /IN is the inverted signal of the input signal IN. A control signal CEN designates activation or inactivation of the counter. Specifically, the control signal CEN inactivates the counter when driven Low and activates it when brought High.

The input signal IN is input to the gates of the NMOS transistors Q5 and Q8 and to the gates of the PMOS transistors Q2 and Q3. The inverted input signal /IN is input to the gates of the PMOS transistors Q1 and Q4 and to the gates of the NMOS transistors Q6 and Q7. The control signal CEN is input to the NAND circuits G23 and G24. The PMOS transistor Q1 and NMOS transistor Q5 are connected to the inverter G21, to the PMOS transistor Q2 and to the NMOS transistor Q6. The inverter G21 is connected to the NAND circuit G23, to the PMOS transistor Q5 and to the NMOS transistor Q7. The NAND circuit G23 is connected to the PMOS transistor Q2 and NMOS transistor Q6. The PMOS transistor Q3 and NMOS transistor Q7 are connected to the NAND circuit G24, to the PMOS transistor Q4 and to the NMOS transistor Q8. The PMOS transistor Q4 and NMOS transistor Q8 are connected to the PMOS transistor Q8 and to the NMOS transistor Q5. The NAND circuit G24 sends out an output signal OUT and, via the inverter G22, outputs the inverted signal /OUT of the output signal OUT.

Described below is the operation of the counter of FIG. 5. FIGS. 6(a)–(e) are timing charts for explaining the operation of the counter of FIG. 5.

Referring to FIGS. 6(a)–(e), the counter is activated when the control signal CEN goes from Low to High. That is, the counter outputs the output signals OUT and /OUT acquired by dividing the input signals IN and /IN by 2. This action is carried out by each of the component counters making up the erase pulse counter of FIG. 4. As a result, the erase pulse counter eventually outputs the erase verify enable signal BE and the inverted erase verify enable signal /BE acquired by dividing the erase pulse EP by a factor of 2n. More specifically, when the erase pulse EP is output 2n times, the erase verify enable signal BE goes from Low to High and the inverted erase verify enable signal /BE from High to Low. Thus the erase verify enable signal BE enables an erase verify operation when driven High, while the inverted erase verify enable signal /BE enables an erase verify operation when brought Low.

Figure 7:
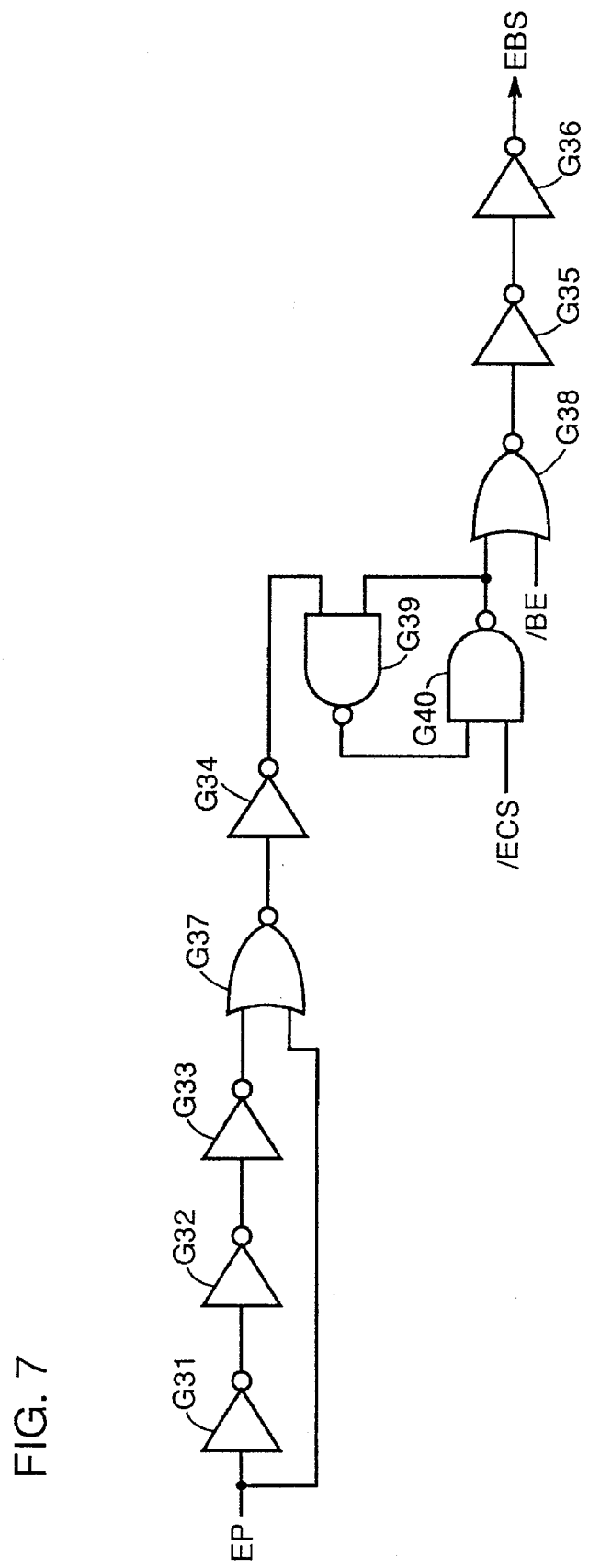
FIG. 7 is a circuit diagram illustrating the structure of the erase verify signal generation circuit shown in FIG. 1.

The erase verify signal generation circuit included in FIG. 1 will now be described in more detail. FIG. 7 is a circuit diagram illustrating the structure of this erase verify signal generation circuit.

Referring to FIG. 7, the erase verify signal generation circuit comprises inverters G31–G36, NOR circuits G37 and G38, and NAND circuits G39 and G40.

An erase pulse EP is input to the inverter G31 and NOR circuit G37. The inverter G31 is connected to the inverter G32 which in turn is coupled to the inverter G33. The inverter G33 is connected to the NOR circuit G37 coupled to the inverter G34. The inverter G34 is connected to the NAND circuit G39. The output terminal of the NAND circuit G39 is connected to one input terminal of the NAND circuit G40. The output terminal of the NAND circuit G40 is connected to one input terminal of the NAND circuit G39. The other input terminal of the NAND circuit G40 receives the inverted erase pulse control signal /ECS from the erase pulse control circuit EPCC. In this setup, the NAND circuits G39 and G40 constitute a latch circuit. The NOR circuit G38 receives the inverted erase verify enable signal /BE and the output signal of the NAND circuit G40. The NOR circuit G38 is connected to the inverter G35 which in turn is connected to the inverter G36. The inverter G36 outputs the erase verify signal EBS.

Below is a description of the operation of the erase verify signal generation circuit of the above constitution. FIGS. 8(a)–(d) are timing charts for explaining the operation of the erase verify signal generation circuit of FIG. 7.

Referring to FIGS. 8(a)–(d), when the inverted erase verify enable signal /BE is High (i.e., erase verify operation not enabled), the erase verify signal EBS remains Low and no erase verify operation takes place. When the inverted erase verify enable signal /BE goes from High to Low and the erase pulse EP also from High to Low, the inverter G34 outputs a low-level pulse. The low-level pulse is latched by the latch circuit composed of the NAND circuits G39 and G40, with the erase verify signal EBS going from Low to High. When the inverted erase pulse control signal /ECS goes from High to Low so as to designate the next erase operation, the latch circuit inverts its output signal, whereby the erase verify signal EBS is driven Low from its high level. As a result, when the inverted erase verify enable signal /BE is Low, the erase verify signal EBS is output at its high level in response to the erase pulse EP and to the inverted erase pulse control signal /ECS. This causes the erase verify operation to take place.

Figure 9:
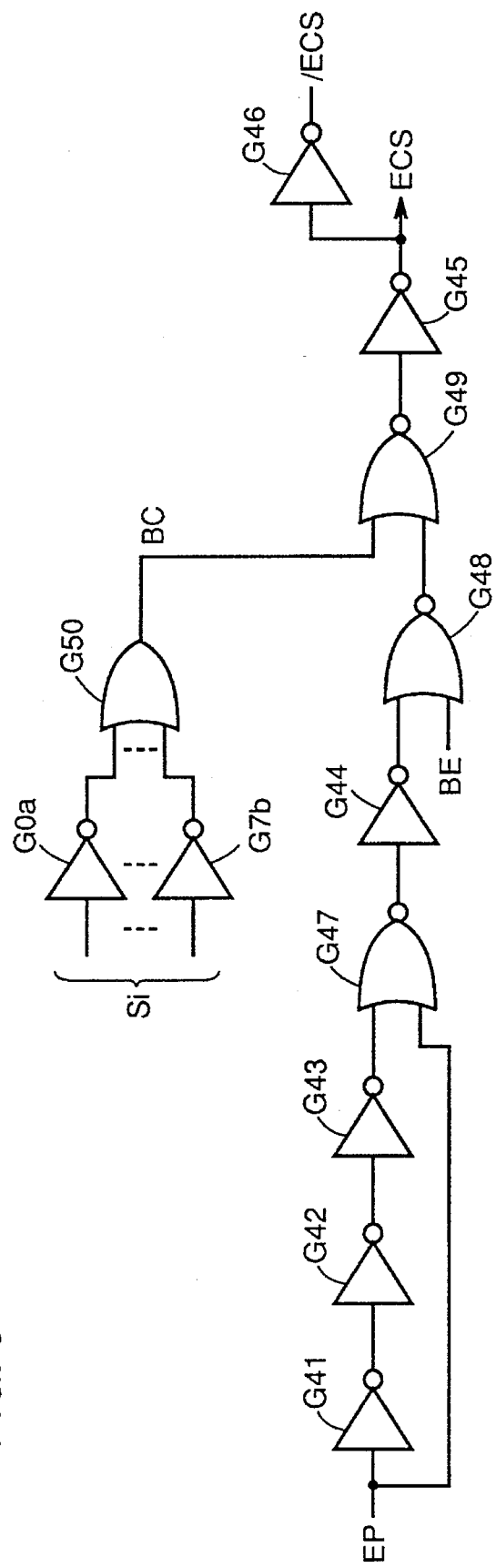
FIG. 9 is a circuit diagram depicting the structure of the erase pulse control circuit shown in FIG. 1.

The erase pulse control circuit shown in FIG. 1 will now be described in more detail. FIG. 9 is a circuit diagram depicting the structure of this erase pulse control circuit.

Referring to FIG. 9, the erase pulse control circuit comprises inverters G41–G46, G0a–G7b; NOR circuits G47–G49, and an OR circuit G50.

An erase pulse EP is input to the inverter G41 and NOR circuit G47. The inverter G41 is connected to the inverter G42 which in turn is connected to the inverter G43. The inverter G43 is coupled to the NOR circuit G47 that is connected to the inverter G44. The inverter G44 is connected to the NOR circuit G48. The NOR circuit G48 receives an erase verify enable signal BE. The NOR circuit G48 is connected to the NOR circuit G49. The inverters G0a–G7b receive the sense amplifier signals Si from the sense amplifiers SA0a–SA7a, SA0b–SA7b. The inverters G0a–G7b are connected to the OR circuit G50. The OR circuit G50 sends a verified result signal BC to the NOR circuit G49. The verified result signal BC is a signal that is output at its high level when at least one of the sense amplifier output signals Si indicates that the erase operation has yet to be completed (i.e., the sense amplifier output signal being Low). That is, the verified result signal BC is output at its high level when another erase operation is deemed necessary after an erase verify operation has been performed following the application of an erase pulse; the signal BC is output at its low level when no further erase operation is necessary. The NOR circuit G49 is connected to the inverter G45. The inverter G45 outputs the erase pulse control signal ECS and also sends out the inverted erase pulse control signal /ECS via the inverter G46.

Figure 10:
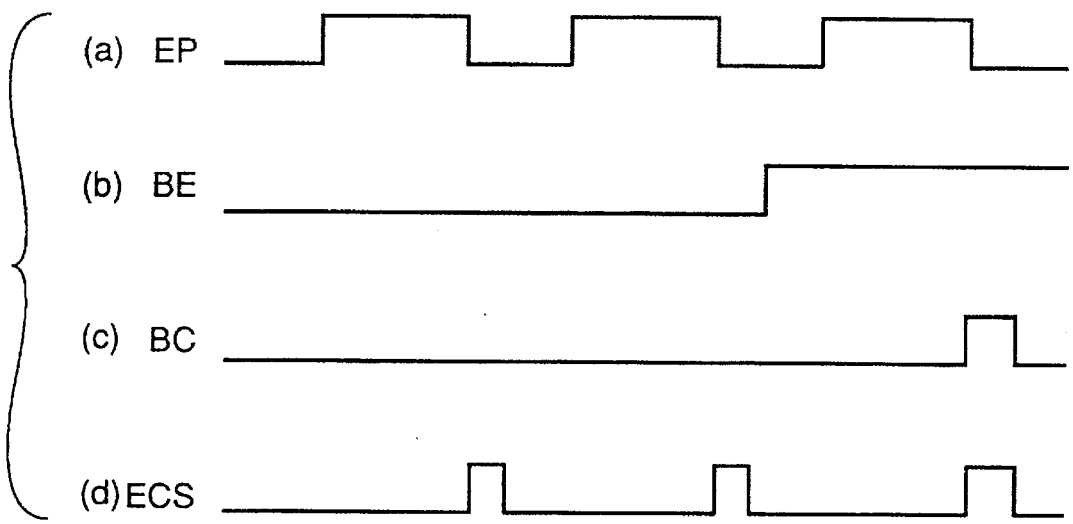
FIGS. 10(a)–(d) are timing charts for explaining the operation of the erase pulse control circuit of FIG. 9.

The operation of the erase pulse control circuit of the above constitution will now be described. FIGS. 10 (a)–(d) are timing charts for explaining the operation of the erase pulse control circuit of FIG. 9.

Referring to FIGS. 10(a)–(d), if the erase verify enable signal is Low (i.e., erase verify operation not enabled), driving the erase pulse EP Low from its high level causes one pulse of the erase pulse control signal ECS to be output at a high level. If the erase verify enable signal BE is High (i.e., erase verify operation enabled) and if at least one of the sense amplifier output signals Si indicates that another erase operation is needed, then the verified result signal BC is output at its high level. This allows one pulse of the erase pulse control signal ECS to be output at its high level. Specifically, when the number of the erase pulses counted by the erase pulse counter has exceeded a predetermined count so that the erase verify enable signal BE enables an erase verify operation, the sense amplifier output signals Si are made effective. Where another erase operation is necessary, the inverted erase pulse control signal /ECS is output with the erase pulse control signal ECS brought High; where no further erase operation is necessary, the inverted erase pulse control signal /ECS is output with the erase pulse control signal ECS driven Low.

Figure 11:
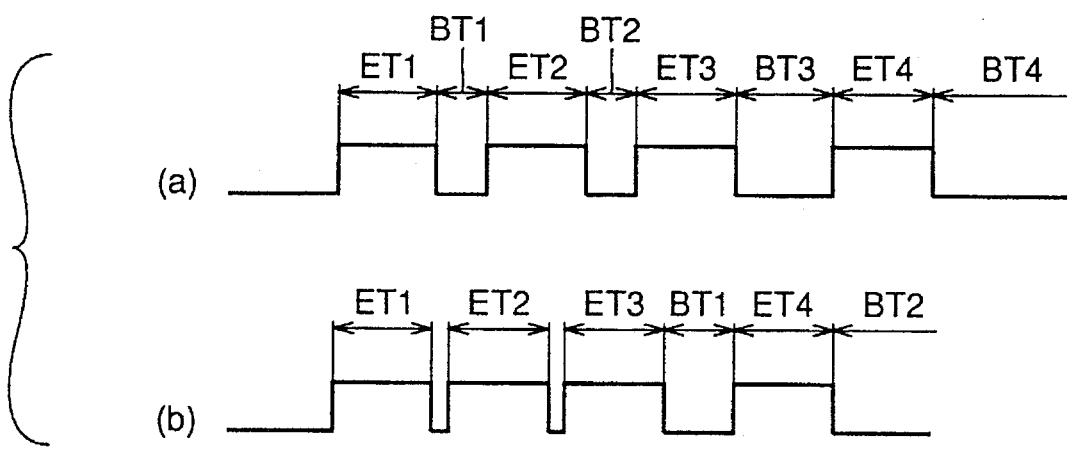
FIGS. 11(a)–(b) are views for explaining the reduction in the erase time for the flash memory of FIG. 1.

Below is a description of the reductions in the erase time of the flash memory of the above constitution. FIGS. 11(a)–(b) are views for explaining the reductions in the erase time of the flash memory of FIG. 1.

FIG. 11(a) shows the erase operations of the conventional flash memory being typically carried out, and FIG. 11(b) indicates the erase operations of the inventive flash memory in FIG. 1 being performed. With the conventional flash memory of FIG. 19, a verify operation BT1 takes place following the initial erase operation ET1 as shown in FIG. 11(a). Thereafter, the erase and the verify operation are repeated in like manner for the second through fourth erase operations ET2–ET6 and the following verify operations BT2–BT6, respectively. As the number of times the erase pulse is applied increases, so does the number of bits to be passed for verification. This prolongs the time required for verification.

For the flash memory of FIG. 1, suppose that the predetermined count (i.e., initial erase upper limit) on the erase pulse count is set illustratively for 2. In that case, as shown in FIG. 11(b), two erase operations ET1 and ET2 are carried out continuously followed by a third erase operation ET3. No verify operation occurs between these erase operations. The third erase operation ET3, upon completion, is followed by a first verify operation BT1. The fourth erase operation ET6 and the verify operation BT2 are then repeated until complete erasure is accomplished. This means that the flash memory practiced as the first embodiment of the invention reduces its erase time by an amount equivalent to two verify operations. Although the erase pulse counter has the count of 2 set thereon in the above example, this is not limitative of the invention. Alternatively, the predetermined count may be set as desired in keeping with the level of the externally supplied high voltage for erasure and with other relevant parameters.

Figure 12:
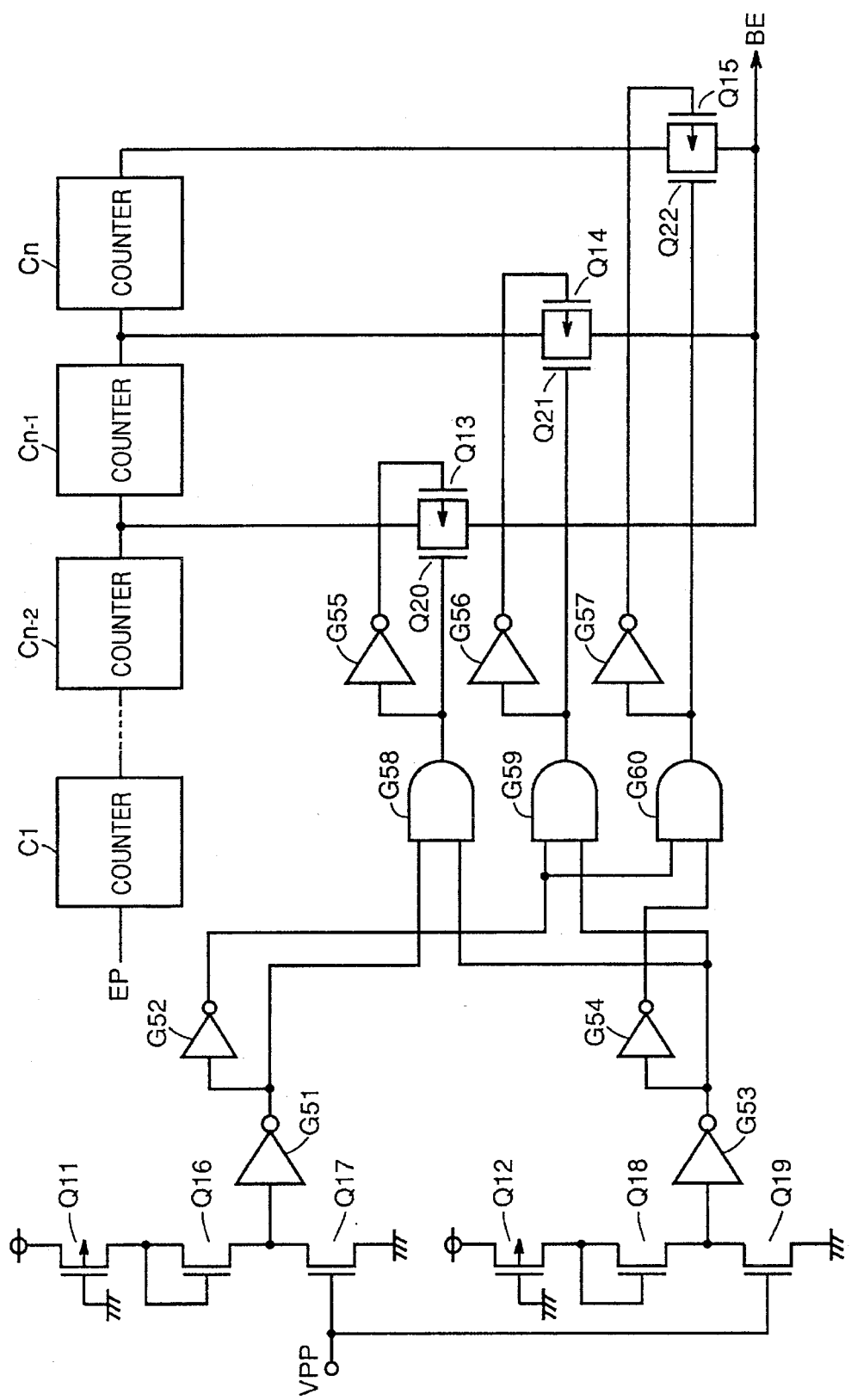
FIG. 12 is a block diagram representing the structure of a second example of the erase pulse counter shown in FIG. 1.

The second example of the erase pulse counter shown in FIG. 1 will now be described. FIG. 12 is a block diagram representing the structure of the second example of the erase pulse counter. The erase pulse counter of FIG. 12 varies its initial erase upper limit only for erase operations in accordance with the level of an externally supplied high voltage VPP, so that the counter outputs an erase verify enable signal BE as per the varied initial erase upper limit.

Referring to FIG. 12, the erase pulse counter comprises PMOS transistors Q11–Q15, NMOS transistors Q16–Q22, inverters G51–G57, AND circuits G58–G60, and counters C1–Cn.

The gate of the NMOS transistor Q17 receives the externally supplied high voltage VPP at the time of an erase operation. One terminal of the NMOS transistor Q17 receives a grounding potential and another terminal thereof is connected to both one terminal of the NMOS transistor Q16 and the inverter G51. Another terminal of the NMOS transistor Q16 is connected to one terminal of the PMOS transistor Q11. The gate of the NMOS transistor Q16 is connected to a connection point connecting the NMOS transistor Q16 with the PMOS transistor Q11. Another terminal of the PMOS transistor Q11 receives a supply voltage VCC and the gate thereof is connected to the grounding potential. The gate width and other parameters of the NMOS transistor Q17 are set so that the transistor is turned on when the level of the high voltage VPP exceeds 12.6 V. In this setup, when the high voltage VPP becomes higher than 12.6 V, the NMOS transistor Q17 is turned on and the inverter G51 outputs a high-level signal; when the high voltage VPP is lower than 12.6 V, the inverter G51 outputs a low-level signal.

The PMOS transistor Q12, NMOS transistors Q18 and Q19, and inverter G53 are also constituted as described. The gate width and other parameters of the NMOS transistor Q19 are set so that the transistor is turned on when the level of the high voltage VPP exceeds 11.3 V. Thus when the high voltage VPP becomes higher than 11.3 V, the inverter G53 outputs a high-level signal; when the high voltage VPP is lower than 11.3 V, the inverter G53 outputs a low-level signal.

The inverter G51 is connected to the AND circuit G58. In addition, the inverter G51 is connected to the AND circuits G59 and G60 via the inverter G52. The inverter G53 is connected to the AND circuits G58 and G59. Furthermore, the inverter G53 is connected to the AND circuit G60 via the inverter G54. The AND circuit G58 is connected to the gate of the PMOS transistor Q20, and to the gate of the PMOS transistor Q13 via the inverter G55. The AND circuit G59 is connected to the gate of the NMOS transistor Q21, and to the gate of the PMOS transistor Q14 via the inverter G56. The AND circuit G60 is connected to the gate of the NMOS transistor Q22, and to the gate of the PMOS transistor Q15 via the inverter G57.

The counter Cn-2 outputs the erase verify enable signal BE via a transmission gate composed of the PMOS transistor Q13 and NMOS transistor Q20. The counter Cn-1 outputs the inverted erase verify enable signal /BE by way of a transmission gate made up of the PMOS transistor Q14 and NMOS transistor Q21. The counter Cn outputs the erase verify enable signal BE through a transmission gate constituted by the PMOS transistor Q15 and NMOS transistor Q22. The counters C1–Cn are connected in series.

In the above setup, when VPP>12.6 V (i.e., the externally supplied high voltage is greater than 12.6 V), the PMOS transistor Q13 and NMOS transistor Q20 are turned on, and the counter Cn-2 outputs the erase verify enable signal BE. When 12.6 V VPP>11.3 V, the PMOS transistor Q14 and NMOS transistor Q21 are turned on, and the counter Cn-1 outputs the erase verify enable signal BE. When 11.3 V>VPP, the PMOS transistor Q15 and NMOS transistor Q22 are turned on, and the counter Cn outputs the erase verify enable signal BE. The above process allows the counter outputs to be switched depending on the level of the high voltage VPP. Thus it is possible to vary the initial erase upper limit, i.e., the predetermined count on the erase pulse counter ordering the erase verify enable signal BE to enable an erase verify operation.

Suppose that a four-counter arrangement is employed, each counter being the dividing counter shown in FIG. 5. In that case, when VPP>12.6 V, a count of 4 erase pulses EP is followed by the output of the erase verify enable signal BE for enabling an erase verify operation (i.e., the signal BE being High). When 12.6 V VPP>11.3 V, a count of 8 erase pulses EP is followed by the output of the erase verify enable signal BE for enabling an erase verify operation. When 11.3 V VPP, a count of 16 erase pulses EP is followed by the high-level erase verify enable signal BE.

With the flash memory, the number of erase pulses needed to erase the memory cells completely varies depending on the level of the externally supplied high voltage VPP. More specifically, the higher the voltage VPP, the smaller the number of necessary erase pulses; lower levels of the high voltage VPP require generating a greater number of erase pulses for complete erasure. When the above-described erase pulse counter is applied to the flash memory of FIG. 1, the number of times the initial erase operation is carried out with no erase verify operation included may be varied depending on the level of the high voltage VPP. The scheme thus eliminates superfluous erase operations and provides further reductions in the erase time.

In the example described above, one of the three counter outputs is output selectively in keeping with the level of the high voltage VPP. Alternatively, the erase verify enable signal BE may be output in accordance with a desired predetermined erase pulse count. Another alternative is to divide the level of the high voltage VPP into a plurality of ranges according to which the initial erase upper limit is varied.

Figure 13:
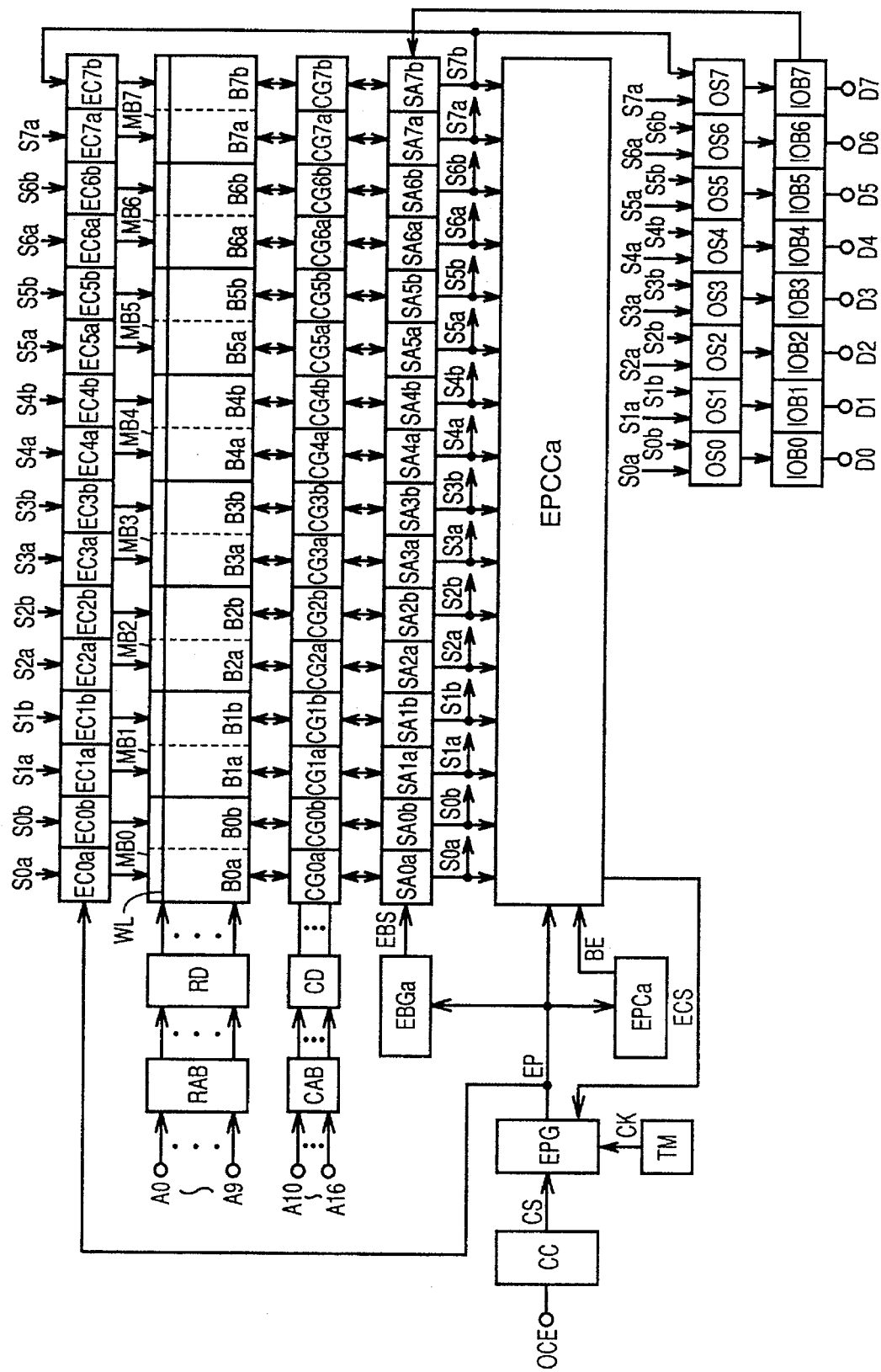
FIG. 13 is a block diagram sketching the structure of a flash memory practiced as a second embodiment of the invention.

The second embodiment of the invention will now be described with reference to the accompanying drawings. FIG. 13 is a block diagram sketching the structure of a flash memory practiced as the second embodiment of the invention. The second embodiment of FIG. 13 differs from the first embodiment of FIG. 1 in terms of the modifications made to the erase verify signal generation circuit, to the erase pulse control circuit and to the erase pulse counter. The other component parts of the second embodiment are identical to their counterparts of the first embodiment in FIG. 1. As such, these common parts are designated by like reference numerals and their descriptions are omitted where redundant.

The erase pulse counter EPCa counts the input erase pulse EP until a predetermined count (i.e., initial erase upper limit) is reached. When the predetermined count is exceeded by the number of times the erase pulse EP is counted, the erase pulse counter EPCa outputs the erase verify enable signal BE to the erase pulse control circuit EPCCa. The erase pulse control circuit EPCCa outputs the erase pulse control signal ECS to the erase pulse generation circuit EPG in response to the erase pulse EP and to the erase pulse enable signal BE. On responding to the erase pulse EP, the erase verify signal generation circuit EBGa outputs the erase verify signal EBS to the sense amplifiers SA0a–SA7a, SA0b–SA7b.

Below is a description of the flash memory of the above constitution operating in erase and erase verify operations. The description that follows concerns an example in which the data in the memory cell array block MB0 is erased. The same process applies to cases where the data in any other memory array blocks MB0–MB7 is erased.

The auto chip erase signal OCE is first input, which causes the control circuit CC to send the erase start signal CS to the erase pulse generation circuit EPG. In response to the erase start signal CS and to the clock signal CK from the internal timer TM, the erase pulse generation circuit EPG outputs a first erase pulse EP to the erase circuits EC0a and EC0b, to the erase verify signal generation circuit EBGa, to the erase pulse control circuit EPCCa, and to the erase pulse counter EPCa. On receiving the erase pulse EP, the erase circuits EC0a and EC0b erase the data in the blocks B0a and B0b.

After erasure, the data in the blocks B0a and B0b is output to the sense amplifiers SA0a and SA0b via the column gates CG0a and CG0b for an erase verify operation. The sense amplifiers SA0a and SA0b output, as a result of the erase verify operation, sense amplifier output signals S0a and S0b to the erase pulse control circuit EPCCa. Given the sense amplifier output signals S0a and S0b, the erase pulse control circuit EPCCa detects therefrom the erased state of the blocks B0a and B0b. Only if the data in all blocks is judged to be unerased, does the erase pulse control circuit EPCCa output the erase pulse control signal ECS. Thus even if any unerased memory cell is detected in the blocks B0a and B0b, the erase verify operation is allowed to continue on the relevant addresses until the data in all blocks is judged to be unerased.

The erase pulse generation circuit EPG then outputs the next erase pulse EP in response to the received erase pulse control signal ECS, and the same process is repeated. Thus with the second embodiment, all target blocks for erasure are fed with the next erase pulse only if their data is all judged to be unerased. Even if the data in one block is judged to be unerased, the erase verify operation is allowed to continue on the addresses involved. Because superfluous erase pulses are not applied for erasure, the erase time is shortened.

The erase pulse control circuit EPCCa receives the erase verify enable signal BE from the erase pulse counter EPCa. As with the flash memory of FIG. 1, the erase verify enable signal BE of the second embodiment is a signal that is output at its high level when the number of the erase pulses EP output by the erase pulse generation circuit EPG exceeds the predetermined count. When the erase verify enable signal BE is Low (i.e., erase pulse count not exceeding the predetermined count), the erase pulse control circuit EPCCa keeps operating in the manner described. When the erase verify enable signal BE is driven High (i.e., the erase pulse count exceeding the predetermined count), the erase pulse control circuit EPCCa stops its operation. At this point, if any one of the sense amplifiers SA0a and SA0b outputs the result of the erase verify operation indicating unerased data, the erase pulse control circuit EPCCa outputs the erase pulse control signal ECS. In response to the erase pulse control signal ECS, the erase pulse generation circuit EPG outputs the next erase pulse EP for erasure.

Until the erase pulse count exceeds the predetermined initial erase upper limit during the above process, the erase pulse is supplied only if the data in all blocks involved is judged to be unerased. When the initial erase upper limit is exceeded, the erase operation is carried out in keeping with the result of the erase verify operation on each block. Thus with no superfluous erase pulses generated, the erase time is reduced.

The erase verify signal generation circuit EBGa shown in FIG. 13 has approximately the same structure as the erase verify signal generation circuit EBG in FIG. 1. This is a circuit that outputs the erase verify signal EBS in response to the erase pulse EP. The erase pulse counter EPCa has a structure similar to that of the erase pulse counter EPC in FIG. 1; the counter is a circuit that outputs the erase verify enable signal BE alone. These component parts will not be discussed further in view of their similarities to their counterparts in the first embodiment.

Figure 14:
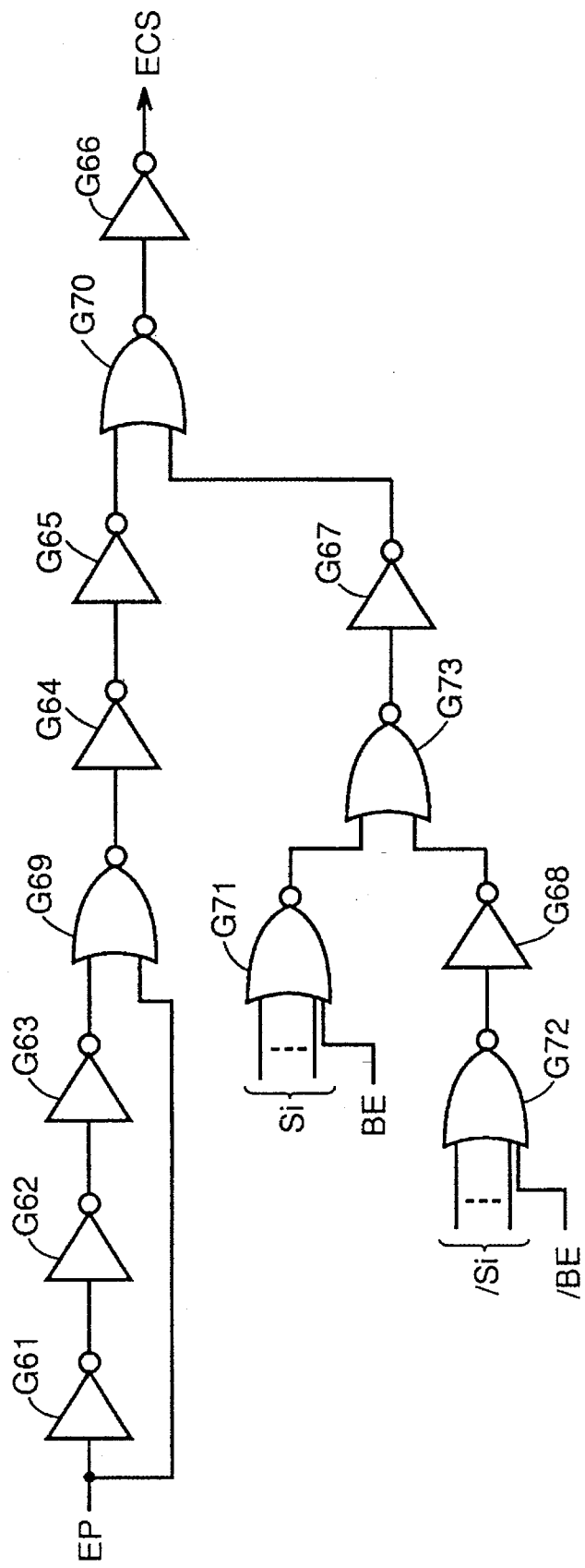
FIG. 14 is a circuit diagram depicting the structure of the erase pulse generation circuit shown in FIG. 13.

The erase pulse control circuit EPCCa shown in FIG. 13 will now be described in more detail. FIG. 14 is a circuit diagram depicting the structure of this erase pulse generation circuit.

Referring to FIG. 14, the erase pulse control circuit EPCCa comprises inverters G61–G68 and NOR circuits G69–G73.

The inverter G61 and NOR circuit G69 receive the erase pulse EP. The inverter G61 is connected to the inverter G62 which in turn is connected to the inverter G63. The inverter G63 is coupled to the NOR circuit G69. The NOR circuit G69 is connected to the inverter G64 that is coupled to the inverter G65. The inverter G65 is connected to the NOR circuit G70.

The NOR circuit G71 receives a plurality of sense amplifier output signals Si and the erase verify enable signal BE. The NOR circuit G72 receives the inverted sense amplifier output signals /Si and the inverted erase verify enable signal /BE. The NOR circuit G72 is connected to the inverter G68. The inverter G68 and NOR circuit G71 are connected to the NOR circuit G73. The NOR circuit G73 is connected to the inverter G67 which in turn is connected to the NOR circuit G70. The NOR circuit G70 is coupled to the inverter G66. The inverter G66 outputs the erase pulse control signal ECS.

The erase pulse control circuit of the above constitution operates as follows: if the erase pulse enable signal BE is Low (i.e., erase pulse count not exceeding the predetermined initial erase upper limit) and if the plurality of sense amplifier output signals Si are all Low (i.e., data in all blocks being judged to be unerased), then the erase pulse control circuit outputs the erase pulse control signal ECS at its high level. On the other hand, if the erase pulse count has reached the initial erase upper limit, if the erase verify enable signal BE is brought High and if at least one of the sense amplifier output signals Si is driven Low (i.e., data in at least one block being judged to be unerased), then one pulse of the erase pulse control signal is output at its high level. The process above ensures that the erase pulse control signal ECS is output only if, with the erase pulse count not reaching the initial erase upper limit, the data in all blocks is judged to be unerased. The above process also ensures that the erase pulse control signal ECS is output if, with the erase pulse count having reached the initial erase upper limit, the data in at least one of the blocks involved is judged to be unerased.

Figure 15:
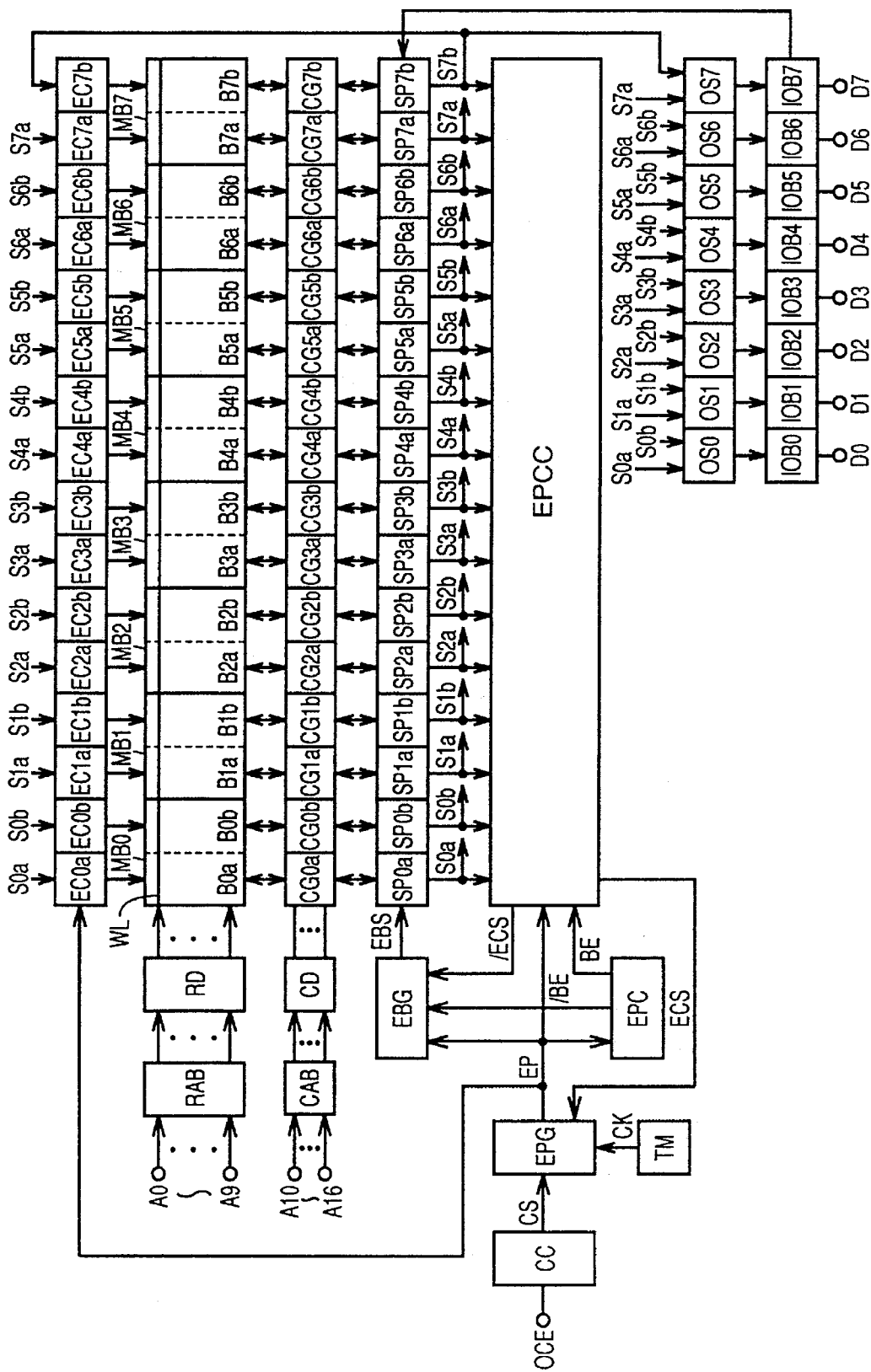
FIG. 15 is a block diagram showing the structure of a flash memory practiced as a third embodiment of the invention.

The third embodiment of the invention will now be described with reference to the accompanying drawings. FIG. 15 is a block diagram giving the structure of a flash memory practiced as the third embodiment of the invention.

The third embodiment in FIG. 15 differs from the flash memory in FIG. 1 in terms of the modifications made to the sense amplifiers (i.e., SP0a–SP7a, SP0b–SP7b, to be described later). The other component parts of the third embodiment are identical to their counterparts of the first embodiment in FIG. 1. As such, these common parts are designated by like reference numerals and their descriptions are omitted where redundant.

With the flash memory of FIG. 15, the sense amplifiers SP0a–SP7a, SP0b–SP7b are equipped with a nonvolatile memory element each. In the stage of chip tests following chip fabrication, the erase speed is measured on each of, say, blocks B0a and B0b making up the memory cell array block MB0. When the most quickly erasable block is found, data is written only to the nonvolatile memory element corresponding to that block. Of the sense amplifiers SP0a and SP0b, the one activated with respect to the data in the nonvolatile memory element, i.e., the sense amplifier corresponding to the most quickly erasable block, outputs the result of the erase verify operation to the erase pulse control circuit EPCC. Until the data in the most quickly erasable block has been erased, the erase pulse control circuit EPCC outputs the erase pulse control signal ECS solely in accordance with the result of the erase verify operation output by the sense amplifier corresponding to the most quickly erasable block. Normally, the data in the remaining blocks should never be erased completely until the data in the most quickly erasable block has been erased. Thus when the erase operation is allowed to continue in keeping with the result of the erase verify operation solely regarding the most quickly erasable block, there is no need to carry out erase verify operations on all blocks. This reduces the erase time involved.

With the third embodiment, the erase verify enable signal BE from the erase pulse counter EPC enters the erase pulse control circuit EPCC. As with the flash memory of FIG. 1, until the erase pulse count reaches the initial erase upper limit, only erase pulses are applied continuously with no erase verify operation carried out in between. When the erase pulse count has exceeded the initial erase upper limit, the erase operation is performed in accordance with the result of the erase verify operation regarding the most quickly erasable block. This scheme further reduces the erase time.

Figure 16:
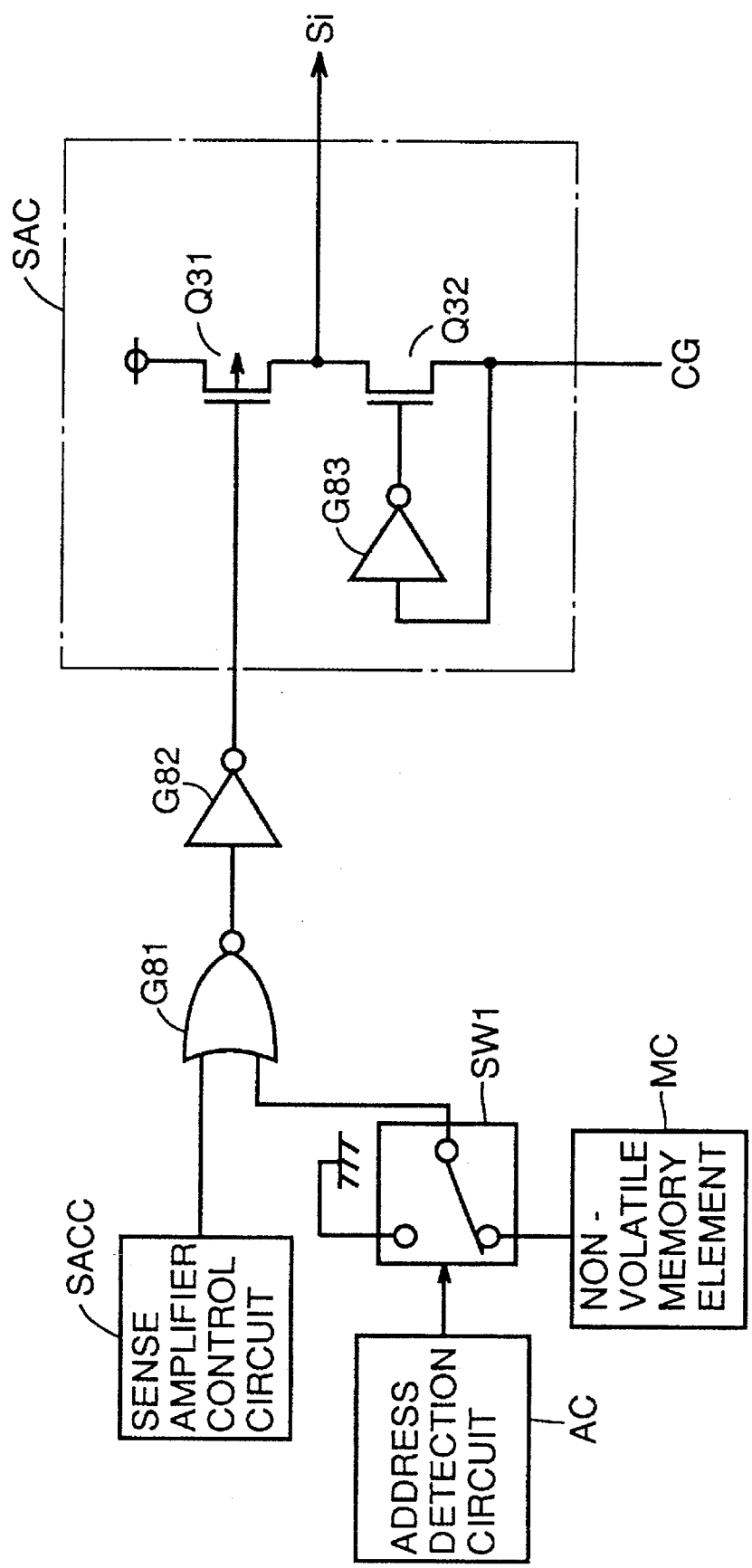
FIG. 16 is a block diagram outlining the structure of a sense amplifier shown in FIG. 15.
Figure 17:
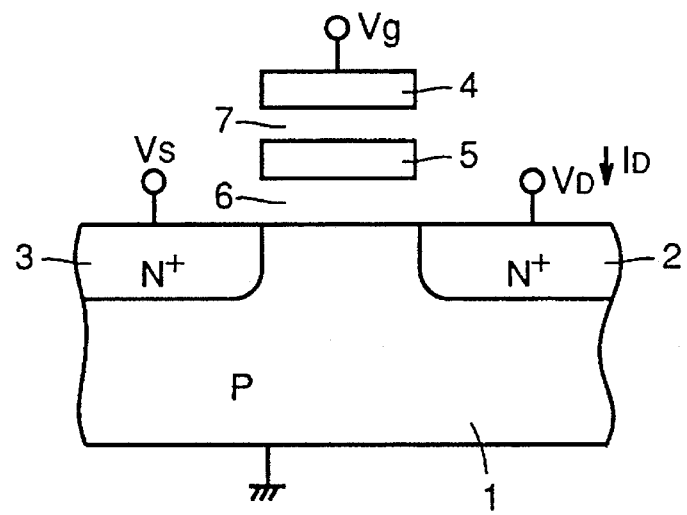
FIG. 17 is a schematic view illustrating a typical memory transistor structure in the conventional flash memory.
Figure 18:
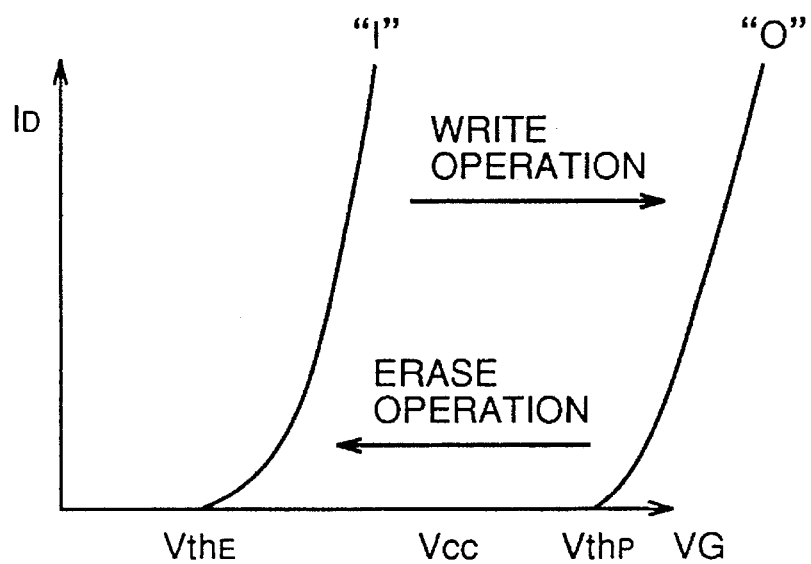
FIG. 18 is a view showing the VG-ID characteristic of the memory transistor.

The sense amplifiers shown in FIG. 15 will now be described in more detail. FIG. 16 is a block diagram outlining the structure of a sense amplifier included in FIG. 15.

Referring to FIG. 16, the sense amplifier comprises a sense amplifier control circuit SACC, an address detection circuit AC, a nonvolatile memory element MC, a sense amplifier circuit SAC, a switch SW1, a NOR gate G81 and an inverter G82. The sense amplifier circuit SAC includes an inverter G83, a PMOS transistor Q31 and an NMOS transistor Q32.

One terminal of the switch SW1 is connected to a grounding potential GND and the other terminal thereof to the nonvolatile memory element MC. In keeping with a control signal from the address detection circuit AC, the switch SW1 connects one output terminal of the NOR circuit G81 either to the grounding potential GND or to the nonvolatile memory element MC. The sense amplifier control circuit SACC outputs a sense amplifier control signal to the NOR circuit G81. The NOR circuit G81 is connected to the inverter G82 which in turn is connected to the gate of the PMOS transistor Q31. One terminal of the PMOS transistor Q31 is connected to the supply voltage VCC and another terminal thereof to the NMOS transistor Q32. Another terminal of the NMOS transistor G32 receives a data signal from a column gate CG. The output terminal of the inverter G83 is connected to the gate of the NMOS transistor Q32; the input terminal of the inverter G83 is connected to another terminal of the NMOS transistor Q32. The sense amplifier output signal Si is output from a connection point that connects the PMOS transistor Q31 with the NMOS transistor Q32.

The sense amplifier of the above construction operates as follows: when the block corresponding to this sense amplifier is the most quickly erasable block, data is written to the nonvolatile memory element MC, and a low-level signal is input to the switch SW1. In the initial state, the switch SW1 switches to the nonvolatile memory element MC so as to let the low-level signal from the nonvolatile memory element MC reach the NOR circuit G81. In this state, the sense amplifier control circuit SACC sends the low-level sense amplifier control signal to the NOR circuit G81. This causes the inverter G82 to effect a low-level output, whereby the sense amplifier circuit SAC is activated. As a result, the data entered through the column gate CG is amplified and output as the sense amplifier signal Si. Meanwhile, no data has been written to the nonvolatile memory elements CM corresponding to the blocks other than the most quickly erasable block. It follows that the signal output by the nonvolatile memory element MC is at the high level. Therefore the output of the inverter G82 remains High regardless of the state of the sense amplifier control signal from the sense amplifier control circuit SACC. The sense amplifier circuit SAC is inactivated, and the sense amplifier output signal Si is not output.

When the data in the most quickly erasable block has been erased, i.e., when the erase verify operation has been completed on up to the last address, the address detection circuit AC detects this state and causes the switch SW1 to switch to the grounding potential. Thus, the sense amplifier SAC is activated or inactivated depending on the sense amplifier control signal from the sense amplifier control circuit SACC, and normal operation is allowed to take place.

As described, the third embodiment of the invention has the most quickly erasable block identified beforehand from among the multiple blocks furnished, and uses the nonvolatile memory element arrangement to store the identified result. In this setup, until the data in the most quickly erasable block has been erased completely, erase pulses are supplied solely in accordance with the result of the erase verify operation regarding the most quickly erasable block. This prevents superfluous erase pulses from getting generated, thereby reducing the erase time. As with the first embodiment, the third embodiment performs erase operations until the predetermined initial erase upper limit is reached. This means that further reductions in the erase time are made available.

Although each of the embodiments described above has the memory cell array blocks MB0–MB7 further divided into two blocks each, this is not limitative of the invention. Alternatively, the invention may be applied just as effectively to cases where the memory cell array blocks are each divided into three or more blocks.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory having memory cell array blocks furnished in accordance with input/output data, said memory cell array blocks being further divided into a plurality of blocks, said nonvolatile semiconductor memory device comprising:

erase pulse output means for outputting erase pulses;

counting means for counting said erase pulses and, when the number of said erase pulses is found to reach an initial erase upper limit, for outputting an erase verify enable signal for enabling an erase verify operation;

erase verify signal output means for outputting an erase verify signal in accordance with said erase verify enable signal;

a plurality of erase verifying means furnished to correspond respectively with said plurality of blocks, said erase verifying means performing erase verify operations on the data stored in the corresponding blocks in response to said erase verify signal; and a plurality of erasing means furnished to correspond respectively with said plurality of blocks, said erasing means erasing the data stored in the corresponding blocks in response to said erase pulses.

2. A nonvolatile semiconductor memory according to claim 1, wherein said counting means includes a plurality of dividing counters serially connected, said counting means dividing said erase pulses successively in order to output said erase verify enable signal.

3. A nonvolatile semiconductor memory according to claim 2, wherein said dividing counters include half-dividing counters.

4. A nonvolatile semiconductor memory according to claim 1, further comprising:

erase pulse control means for outputting an erase pulse control signal in response to said erase pulses when said erase verify enable signal does not designate the enabling of an erase verify operation, said erase pulse control means further outputting said erase pulse control signal in accordance with the result of the verification made by said erase verifying means when said erase verify enable signal designates the enabling of an erase verify operation;

wherein said erase pulse output means outputs said erase pulses in response to said erase pulse control signal.

5. A nonvolatile semiconductor memory according to claim 4, wherein said erase pulse output means includes:

a first NAND circuit for having one input terminal thereof receive a predetermined clock signal;

a first inverter for receiving the output of said first NAND circuit;

a second inverter for receiving the output of said first inverter;

a third inverter for receiving the output of said second inverter;

a fourth inverter for receiving the output of said third inverter;

a first NOR circuit for receiving the output of said first inverter and the output of said fourth inverter;

a fifth inverter for receiving the output of said first NOR circuit;

a second NAND circuit for having one input terminal thereof receive the output of said fifth inverter;

a second NOR circuit for receiving a predetermined erase start signal and said erase pulse control signal;

a third NAND circuit for receiving the output of said second NAND circuit and the output of said second NOR circuit, the output terminal of said third NAND circuit being connected to the other input terminal of said second NAND circuit; and a sixth inverter for receiving the output of said second NAND circuit;

wherein the output of said sixth inverter is input to the other input terminal of said first NAND circuit and is output as said erase pulses.

6. A nonvolatile semiconductor memory according to claim 4, wherein said erase verify signal output means includes:

a first inverter for receiving said erase pulses;

a second inverter for receiving the output of said first inverter;

a third inverter for receiving the output of said second inverter;

a first NOR circuit for receiving the output of said third inverter and said erase pulses;

a fourth inverter for receiving the output of said first NOR circuit;

a first NAND circuit for having one input terminal thereof receive the output of said fourth inverter;

a second NAND circuit for receiving the output of said first NAND circuit and the inverted signal of said erase pulse control signal, the output terminal of said second NAND circuit being connected to the other input terminal of said first NAND circuit;

a second NOR circuit for receiving the inverted signal of said erase verify enable signal and the output of said second NAND circuit;

a fifth inverter for receiving the output of said second NOR circuit; and a sixth inverter for receiving the output of said fifth inverter.

7. A nonvolatile semiconductor memory according to claim 4, wherein said erase pulse control means includes:

a first inverter for receiving said erase pulses;

a second inverter for receiving the output of said first inverter;

a third inverter for receiving the output of said second inverter;

a first NOR circuit for receiving the output of said third inverter and said erase pulses;

a fourth inverter for receiving the output of said first NOR circuit;

a second NOR circuit for receiving the output of said fourth inverter and said erase verify enable signal;

a verified result signal output circuit for outputting a verified result signal at a high level when new erasure is deemed necessary in view of the result of the erase verify operation performed by said erase verifying means, said verified result signal output circuit further outputting said verified result signal at a low level when such new erasure is deemed unnecessary;

a third NOR circuit for receiving the output of said second NOR circuit and said verified result signal;

a fifth inverter for receiving the output of said third NOR circuit; and a sixth inverter for receiving the output of said fifth inverter;

wherein said fifth inverter outputs said erase pulse control signal and said sixth inverter outputs the inverted signal of said erase pulse control signal.

8. A nonvolatile semiconductor memory according to claim 1, wherein said counting means varies said initial erase upper limit in accordance with the level of a high voltage supplied externally to the semiconductor memory.

9. A nonvolatile semiconductor memory according to claim 8, wherein said counting means includes:

a plurality of dividing counters serially connected;

level detecting means for detecting the level of said high voltage; and output means for taking the output of one of said dividing counters in accordance with the high voltage level detected by said level detecting means and for outputting that output as said erase verify enable signal.

10. A nonvolatile semiconductor memory according to claim 9, wherein said level detecting means includes:

first level detecting means for outputting a first level detection signal when the level of said high voltage is higher than the level of a predetermined first voltage; and second level detecting means for outputting a second level detection signal when the level of said high voltage is lower than a predetermined second voltage which is lower than the first voltage.

11. A nonvolatile semiconductor memory according to claim 10, wherein said first level detection means includes:

a first PMOS transistor having one terminal thereof receive a supply voltage and having the gate thereof receive a grounding potential;

a first NMOS transistor having one terminal thereof connected to another terminal of said first PMOS transistor in a diode connection;

a second NMOS transistor having one terminal thereof connected to another terminal of said first NMOS transistor, another terminal of said second NMOS transistor receiving said grounding potential, the gate of said second NMOS transistor receiving said high voltage; and a first inverter for receiving the potential of a connection point connecting said first NMOS transistor with said second NMOS transistor;

wherein said second level detecting means includes:

a second PMOS transistor having one terminal thereof receive said supply voltage and having the gate thereof receive said grounding potential;

a third NMOS transistor having one terminal thereof connected to another terminal of said second PMOS transistor in a diode connection;

a fourth NMOS transistor having one terminal thereof connected to another terminal of said third NMOS transistor, another terminal of said fourth NMOS transistor receiving said grounding potential, the gate of said fourth NMOS transistor receiving said high voltage; and a second inverter for receiving the potential of a connection point connecting said third NMOS transistor with said fourth NMOS transistor; and wherein said first level detecting means outputs said first level detection signal at a high level when the level of said high voltage is greater than 12.6 V, and said second level detecting means outputs said second level detection signal at a high level when the level of said high voltage is greater than 11.3 V.

12. A nonvolatile semiconductor memory according to claim 10, wherein said output means includes:

a first inverter for receiving said first level detection signal;

a second inverter for receiving said second level detection signal;

a first AND circuit for receiving said first level detection signal and said second level detection signal;

a second AND circuit for receiving the output of said first inverter and said second level detection signal;

a third AND circuit for receiving the output of said first inverter and the output of said second inverter;

a first transmission gate operating in response to the output of said first AND circuit;

a second transmission gate operating in response to the output of said second AND circuit; and a third transmission gate operating in response to the output of said third AND circuit;

wherein said plurality of dividing counters include:
a first dividing counter;
a second dividing counter for dividing the output of said first dividing counter; and
a third dividing counter for dividing the output of said second dividing counter; and
wherein said first, said second and said third transmission gate output the outputs of said first, said second and said third dividing counter, respectively.

13. A nonvolatile semiconductor memory comprising:

a memory cell array including a plurality of nonvolatile memory cells for storing data;

erase pulse output means for outputting erase pulses;

counting means for counting said erase pulses and, when the number of said erase pulses is found to reach an initial erase upper limit, for outputting an erase verify enable signal for enabling an erase verify operation;

erase verify signal output means for outputting an erase verify signal in accordance with said erase verify enable signal;

erase verifying means for performing erase verify operations on the data stored in said memory cell array; and erasing means for erasing the data stored in said memory cell array in response to said erase pulses;

wherein said counting means varies said initial erase upper limit in accordance with the level of a high voltage supplied externally to the semiconductor memory.

14. A nonvolatile semiconductor memory according to claim 13, wherein said counting means includes:

a plurality of dividing counters serially connected;

level detecting means for detecting the level of said high voltage; and output means for taking the output of one of said dividing counters in accordance with the high voltage level detected by said level detecting means and for outputting that output as said erase verify enable signal.

15. A nonvolatile semiconductor memory according to claim 14, wherein said level detecting means includes:

first level detecting means for outputting a first level detection signal when the level of said high voltage is higher than the level of a predetermined first voltage; and second level detecting means for outputting a second level detection signal when the level of said high voltage is lower than a predetermined second voltage which is lower than the first voltage.

16. A nonvolatile semiconductor memory according to claim 15, wherein said first level detection means includes:

a first PMOS transistor having one terminal thereof receive a supply voltage and having the gate thereof receive a grounding potential;

a first NMOS transistor having one terminal thereof connected to another terminal of said first PMOS transistor in a diode connection;

a second NMOS transistor having one terminal thereof connected to another terminal of said first NMOS transistor, another terminal of said second NMOS transistor receiving said grounding potential, the gate of said second NMOS transistor receiving said high voltage; and a first inverter for receiving the potential of a connection point connecting said first NMOS transistor with said second NMOS transistor;

wherein said second level detecting means includes:
a second PMOS transistor having one terminal thereof receive said supply voltage and having the gate thereof receive said grounding potential;
a third NMOS transistor having one terminal thereof connected to another terminal of said second PMOS transistor in a diode connection;
a fourth NMOS transistor having one terminal thereof connected to another terminal of said third NMOS transistor, another terminal of said fourth NMOS transistor receiving said grounding potential, the gate of said fourth NMOS transistor receiving said high voltage; and
a second inverter for receiving the potential of a connection point connecting said third NMOS transistor with said fourth NMOS transistor; and
wherein said first level detecting means outputs said first level detection signal at a high level when the level of said high voltage is greater than 12.6 V, and said second level detecting means outputs said second level detection signal at a high level when the level of said high voltage is greater than 11.3 V.

17. A nonvolatile semiconductor memory according to claim 15, wherein said output means includes:

a first inverter for receiving said first level detection signal;

a second inverter for receiving said second level detection signal;

a first AND circuit for receiving said first level detection signal and said second level detection signal;

a second AND circuit for receiving the output of said first inverter and said second level detection signal;

a third AND circuit for receiving the output of said first inverter and the output of said second inverter;

a first transmission gate operating in response to the output of said first AND circuit;

a second transmission gate operating in response to the output of said second AND circuit; and a third transmission gate operating in response to the output of said third AND circuit;

wherein said plurality of dividing counters include:
a first dividing counter;
a second dividing counter for dividing the output of said first dividing counter; and
a third dividing counter for dividing the output of said second dividing counter; and
wherein said first, said second and said third transmission gate output the outputs of said first, said second and said third dividing counter, respectively.

18. A nonvolatile semiconductor memory having memory cell array blocks furnished in accordance with input/output data, said memory cell array blocks being further divided into a plurality of blocks, said nonvolatile semiconductor memory comprising:

erase pulse output means for outputting erase pulses;

a plurality of erase verifying means furnished to correspond respectively with said plurality of blocks, said erase verifying means performing erase verify operations on the data stored in the corresponding blocks;

a plurality of erasing means furnished to correspond respectively with said plurality of blocks, said erasing means erasing the data stored in the corresponding blocks in response to said erase pulses; and erase pulse control means for outputting an erase pulse control signal in response to said erase pulses when said erase verifying means judge that all data stored in said plurality of blocks has yet to be erased;

wherein said erase pulse output means outputs said erase pulses in response to said erase pulse control signal.

19. A nonvolatile semiconductor memory according to claim 18, further comprising:

counting means for counting said erase pulses and, when the number of said erase pulses is found to reach an initial erase upper limit, for outputting a command signal for designating a normal erase operation;

wherein said erase pulse control means outputs said erase pulse control signal in response to said erase pulses when, with said command signal not designating said normal erase operation, said erase verifying means judge that all data stored in said plurality of blocks has yet to be erased; said erase pulse control means further outputting said erase pulse control signal in response to said erase pulses when, with said command signal designating said normal erase operation, said erase verifying means judge that the data stored in at least one of said plurality of blocks has yet to be erased.

20. A nonvolatile semiconductor memory according to claim 19, wherein said erase pulse control means includes:

a first NOR circuit for receiving an output signal from said plurality of erase verifying means and said command signal from said counting means, said output signal indicating the result of erase verify operations performed by said plurality of erase verifying means;

a second NOR circuit for receiving the inverted signal of said output signal from said plurality of erase verifying means and the inverted signal of said command signal from said counting means, said output signal indicating the result of erase verify operations performed by said plurality of erase verifying means;

a first inverter for receiving the output of said second NOR circuit;

a third NOR circuit for receiving the output of said first NOR circuit and the output of said first inverter;

a second inverter for receiving the output of said third NOR circuit;

a third inverter for receiving said erase pulses;

a fourth inverter for receiving the output of said third inverter;

a fifth inverter for receiving the output of said fourth inverter;

a fourth NOR circuit for receiving the output of said fifth inverter and said erase pulses;

a sixth inverter for receiving the output of said fourth NOR circuit;

a seventh inverter for receiving the output of said sixth inverter;

a fifth NOR circuit for receiving the output of said seventh inverter and the output of said second inverter; and an eighth inverter for receiving the output of said fifth NOR circuit.

21. A nonvolatile semiconductor memory having memory cell array blocks furnished in accordance with input/output data, said memory cell array blocks being further divided into a plurality of blocks, one of said plurality of blocks being able to be erased more quickly than the other blocks, said nonvolatile semiconductor memory comprising:

erase pulse output means for outputting erase pulses;

a plurality of erase verifying means furnished to correspond respectively with said plurality of blocks, said erase verifying means performing erase verify operations on the data stored in the corresponding blocks;

a plurality of erasing means furnished to correspond respectively with said plurality of blocks, said erasing means erasing the data stored in the corresponding blocks in response to said erase pulses; and erase pulse control means for outputting an erase pulse control signal until all data stored in the most quickly erasable block has been erased, the output of said erase pulse control signal being effected solely in accordance with the judgment made by the erase verifying means which, selected from among said plurality of erase verifying means, corresponds to said most quickly erasable block;

wherein said erase pulse output means outputs said erase pulses in response to said erase pulse control signal.

22. A nonvolatile semiconductor memory according to claim 21, wherein said designating means includes a plurality of nonvolatile memory elements furnished to correspond respectively with said plurality of blocks;

wherein data is written to only those of said plurality of nonvolatile memory elements which correspond to said most quickly erasable block; and wherein said erase verifying means are activated in accordance with the data stored in said plurality of nonvolatile memory elements and according to a predetermined control signal.

23. A nonvolatile semiconductor memory according to claim 22, wherein said erase verifying means include:

a sense amplifier control circuit for outputting a sense amplifier control signal as said predetermined control signal;

an address detection circuit for detecting the completion of erase verify operations on up to the last address;

a switch for selecting one of a nonvolatile memory element output and a low-level signal in accordance with the output of said address detection circuit;

a NOR circuit for receiving said sense amplifier control signal and the output of said switch;

an inverter for receiving the output of said NOR circuit; and a sense amplifier operating in response to the output of said inverter.

* * * * *

UNITED STATES PATENT AND TRADEMARK OFFICE
CERTIFICATE OF CORRRECTION

PATENT NO.  : 5,583,809
DATED       : December 10, 1996
INVENTOR(S) : Kenji Noguchi et al.

It is certified that error appears in the above-identified patent and that said Letters Patent is hereby corrected as shown below:

On the title page, item [56] insert the following references:

FOREIGN PATENT OR PUBLISHED FOREIGN PATENT APPLICATION

| | | DOCUMENT NUMBER | | | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|---|
| | | 6 | 1 | 3 | 9 | 7 | 8 | 5A | 10/27/92 | Japan | | | | |
| | | | | | | | | | | | | | | |

OTHER DOCUMENTS

| | | |
|---|---|---|
| | German Office Action dated November 11, 1996, and translation thereof | |
| | | |
| | | |

Signed and Sealed this

Ninth Day of March, 1999

*Attest:*

Q. TODD DICKINSON

*Attesting Officer*  *Acting Commissioner of Patents and Trademarks*